(12) United States Patent
Liu et al.

(10) Patent No.: US 12,527,050 B2
(45) Date of Patent: Jan. 13, 2026

(54) INTEGRATED CIRCUIT STRUCTURE WITH SOURCE/DRAIN SPACERS

(71) Applicant: Taiwan Semiconductor Manufacturing Company, Ltd., Hsin-Chu (TW)

(72) Inventors: Ko-Cheng Liu, Hsinchu (TW); Ming-Lung Cheng, Kaohsiung County (TW); Chang-Miao Liu, Hsinchu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 393 days.

(21) Appl. No.: 18/341,334

(22) Filed: Jun. 26, 2023

(65) Prior Publication Data
US 2023/0352530 A1 Nov. 2, 2023

Related U.S. Application Data

(62) Division of application No. 17/193,721, filed on Mar. 5, 2021, now Pat. No. 11,688,768.

(51) Int. Cl.
*H01L 29/06* (2006.01)
*H01L 29/08* (2006.01)
(Continued)

(52) U.S. Cl.
CPC ......... *H10D 62/121* (2025.01); *H10D 30/014* (2025.01); *H10D 30/43* (2025.01);
(Continued)

(58) Field of Classification Search
CPC .... H10D 30/014; H10D 30/024; H10D 30/43; H10D 30/62; H10D 30/6211; H10D 30/6212; H10D 30/6213; H10D 30/6219; H10D 30/6713; H10D 30/6735; H10D 30/6757; H10D 30/797; H10D 62/021; H10D 62/118; H10D 62/119; H10D 62/121; H10D 62/149; H10D 62/151;
(Continued)

(56) References Cited

U.S. PATENT DOCUMENTS 8,836,016 B2  9/2014  Wu et al.
8,841,701 B2 * 9/2014  Lin .................. H10D 62/83
                                                        257/65
(Continued)

*Primary Examiner* — David C Spalla
(74) *Attorney, Agent, or Firm* — HAYNES AND BOONE, LLP

(57) ABSTRACT

The method includes receiving a semiconductor workpiece having active regions extending above a top surface of a semiconductor substrate, forming first dielectric features on first opposing sidewalls of the active regions across a first direction, forming second dielectric features extending between opposing sidewalls of the first dielectric features, and etching portions of the active region to form source/drain trenches. The source/drain trenches expose second opposing sidewalls of the active region. The method further includes recessing the first dielectric features and forming source/drain features in the source/drain trenches and on the exposed second opposing sidewalls of the active region. The source/drain features are partially formed on top surfaces of the first dielectric features.

20 Claims, 29 Drawing Sheets

(51) Int. Cl.

| | |
|---|---|
| *H01L 29/66* | (2006.01) |
| *H01L 29/775* | (2006.01) |
| *H01L 29/786* | (2006.01) |
| *H10D 30/01* | (2025.01) |
| *H10D 30/43* | (2025.01) |
| *H10D 30/67* | (2025.01) |
| *H10D 62/00* | (2025.01) |
| *H10D 62/10* | (2025.01) |
| *H10D 62/13* | (2025.01) |
| *H10D 64/01* | (2025.01) |

(52) U.S. Cl.
CPC ....... *H10D 30/6757* (2025.01); *H10D 62/021* (2025.01); *H10D 62/151* (2025.01); *H10D 64/017* (2025.01); *H10D 30/6735* (2025.01)

(58) Field of Classification Search
CPC .. H10D 64/015; H10D 64/017; H10D 64/018; H10D 64/021; H10D 84/013; H10D 84/0158; H10D 84/017; H10D 84/0193; H10D 84/834; H10D 84/853
See application file for complete search history.

(56) References Cited

U.S. PATENT DOCUMENTS

| | | | |
|---|---|---|---|
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 11,948,988 B2* | 4/2024 | More | H10D 30/6211 |
| 12,027,417 B2* | 7/2024 | Bomberger | H10D 30/62 |
| 2018/0254348 A1 | 9/2018 | Ching et al. | |
| 2020/0365690 A1* | 11/2020 | Jeong | H10D 84/834 |
| 2022/0051939 A1* | 2/2022 | Yang | H01L 21/7682 |

* cited by examiner

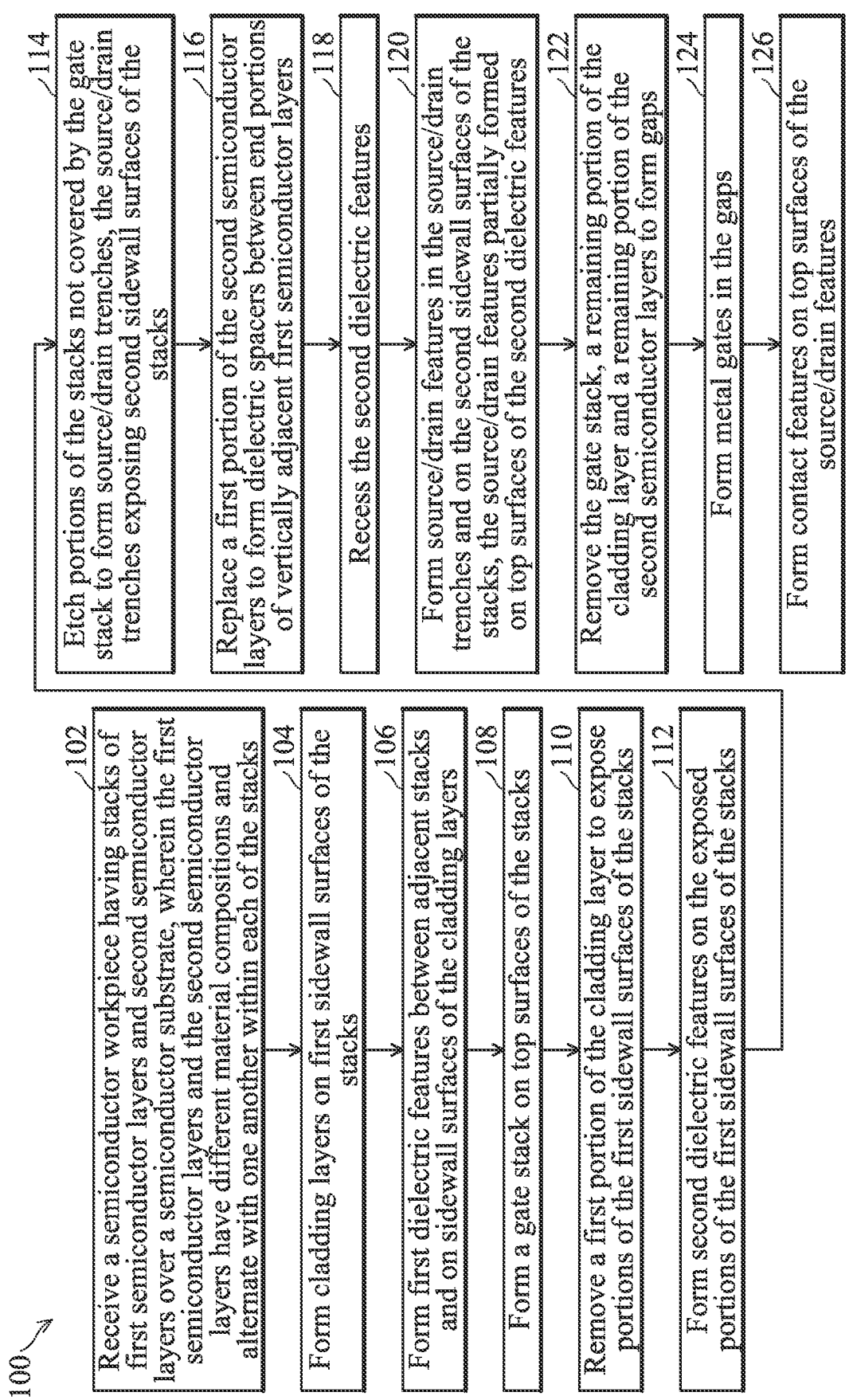

INTEGRATED CIRCUIT STRUCTURE WITH SOURCE/DRAIN SPACERS

PRIORITY DATA

This is a divisional application of U.S. patent application Ser. No. 17/193,721, filed on Mar. 5, 2021, the entire disclosure of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, nano-sheet-based devices have been introduced in an effort to improve gate control by increasing gate-channel coupling, reduce OFF-state current, and reduce short-channel effects (SCEs). Nano-sheet-based devices include a plurality of channel layers stacked together to form the transistor channels which are engaged by a gate structure. The nano-sheet-based devices are compatible with conventional complementary metal-oxide-semiconductor (CMOS) processes, allowing them to be aggressively scaled down while maintaining gate control and mitigating SCEs. However, due to the complex device structures, it may be challenging to strike a balance between an optimal current density and a low fringe capacitance. Therefore, although conventional nano-sheet-based devices have been generally adequate for their intended purposes, they are not satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 9B' and 9B" illustrate fragmentary cross-sectional views of an example workpiece of the present disclosure along the line B-B' in FIG. 9A, according to various aspects of the present disclosure.

FIG. 12 is a flow chart of an example method of the present disclosure according to various aspects of the present disclosure.

DETAILED DESCRIPTION

Figure 1B:
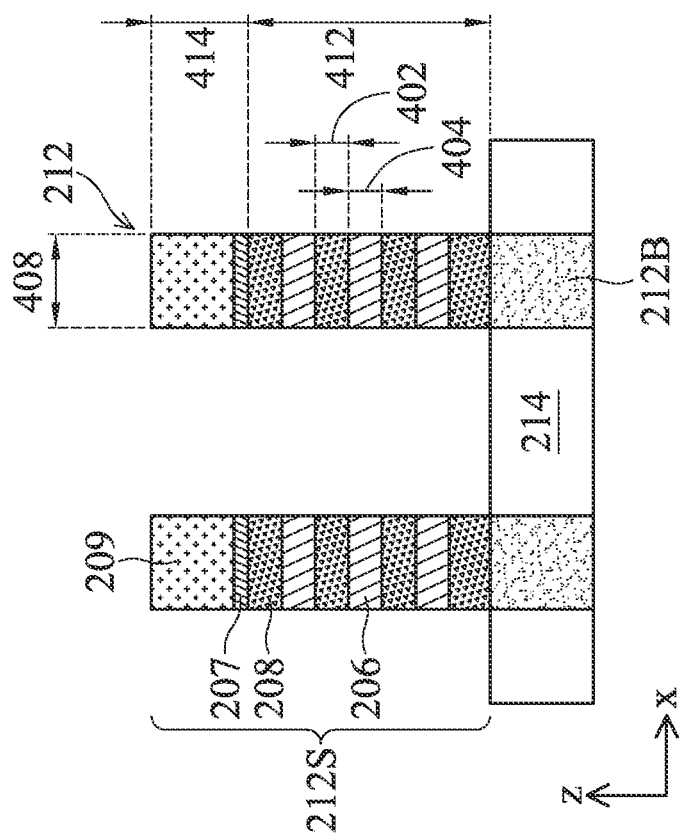
FIGS. 1B, 2B, 3B, 4B, 5B, 6B, 7B, 8B, 9B, and 10B illustrate fragmentary cross-sectional views of an example workpiece of the present disclosure along the line B-B' in FIGS. 1A, 2A, 3A, 4A, 5A, 6A, 7A, 8A, 9A, and 10A, respectively, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to ICs and semiconductor devices and methods of forming the same. More particularly, the present disclosure is related to vertically-stacked horizontally-oriented multi-channel transistors, such as nanowire transistors and nanosheet transistors. These types of transistors are sometimes referred to as gate-all-around (GAA) transistors, multi-bridge-channel (MBC) transistors, or some other names. In the present disclosure, they are broadly referred to as nano-sheet-based transistors (or transistors, or simply devices). A nano-sheet-based device includes a plurality of channel layers stacked one on top of another and engaged by a gate structure. The channel layers of a nano-sheet-based device may include any suitable shapes and/or configurations. For example, the channel layers may be in one of many different shapes, such as wire (or nanowire), sheet (or nanosheet), bar (or nanobar), and/or other suitable shapes. In other words, the term nano-sheet-based devices broadly encompasses devices having channel layers in nanowire, nano-bars, and any other suitable shapes. Further, the channel layers of the nano-sheet-based devices may engage with a single, contiguous gate structure, or multiple gate structures. The channel layers connect a pair of source/drain features, such that the charge carriers may flow from the source region to the drain region through the channel layers during the operation (such as when the transistors are turned on). Additionally, inner spacers are formed between the source/drain features and the gate structures such that the source/drain features may be shielded from the operations targeting the gate structure. The nano-sheet based devices presented herein may be a complementary metal-oxide-semiconductor (CMOS) device, a p-type metal-oxide-semiconductor (PMOS) device, or an n-type metal-oxide-semiconductor (NMOS) device. One of ordinary skill may recognize other examples of semiconductor devices that may benefit from aspects of the present disclosure. Moreover, although the disclosure uses nano-sheet-based devices as an example, one of ordinary skill may recognize other examples of semiconductor devices that may benefit from aspects of the present disclosure. For example, other types of metal-oxide semiconductor field effect transistors (MOSFETs), such as planar MOSFETs, FinFETs, other multi-gate FETs may benefit from aspects of the present disclosure.

In a typical nano-sheet-based device, the source/drain features grow from and cover the entirety of sidewall surfaces of the channel layers. This ensures the full capacity of the channel layers for conductivity are utilized in operation. Moreover, the growths of the source/drain features often extend laterally beyond edges of the channel layers (e.g. along the lengthwise direction of the gate structures) such that the source/drain features span a greater width than the channel layers themselves. This larger lateral width does not improve the charge conductivity of the transistor, but does provide a larger landing platform for subsequently formed contact features which helps reduce the contact resistance therebetween. However, the increased lateral dimension of the source/drain features, as compared to the channel layers, also contributes to an increased fringe capacitance of the device, which offsets the described benefits and sometimes even adversely impacts the device performances. Accordingly, the present disclosure provides methods that allow formation of source/drain features having a narrower bottom portion and a wider top portion, such that the contact resistance between the source/drain features and the contact features is minimized while the fringe capacitance does not unnecessarily increase.

The various aspects of the present disclosure will now be described in more detail with reference to the figures. FIGS. 1A-10A illustrate three-dimensional (3D) views of a workpiece 200 at different stages of fabrication according to embodiments of the method of the present disclosure. FIGS. 1B-10B and 11 illustrate cross-sectional views of the workpiece 200 (such as of an X-Z cross-section along the B-B' line of the corresponding FIGS. 1A-10A). FIGS. 3C-10C, 3D-10D, 7E-10E, 7F-10F, and 7G-10G illustrate fragmentary cross-sectional views of an example workpiece 200 of the present disclosure along the line C-C', the line D-D', the line E-E', the line F-F', and the line G-G' in FIGS. 3A-10A, respectively, according various aspects of the present disclosure. FIG. 12 illustrates a flowchart of a method 100 for forming a semiconductor device 200 from a workpiece 200 according to one or more aspects of the present disclosure. Method 100 is merely an example and is not intended to limit the present disclosure to what is explicitly illustrated in method 100. Additional steps may be provided before, during and after method 100, and some steps described can be replaced, eliminated, or moved around for additional embodiments of the method. Not all steps are described herein in detail for reasons of simplicity. Similarly, FIGS. 1A-10A, 1B-10B, 3C-10C, 3D-10D, 7E-10E, 7F-10F, 7G-10G and 11 have been abbreviated for simplicity and clarity, and may not include all features.

Figure 1A:
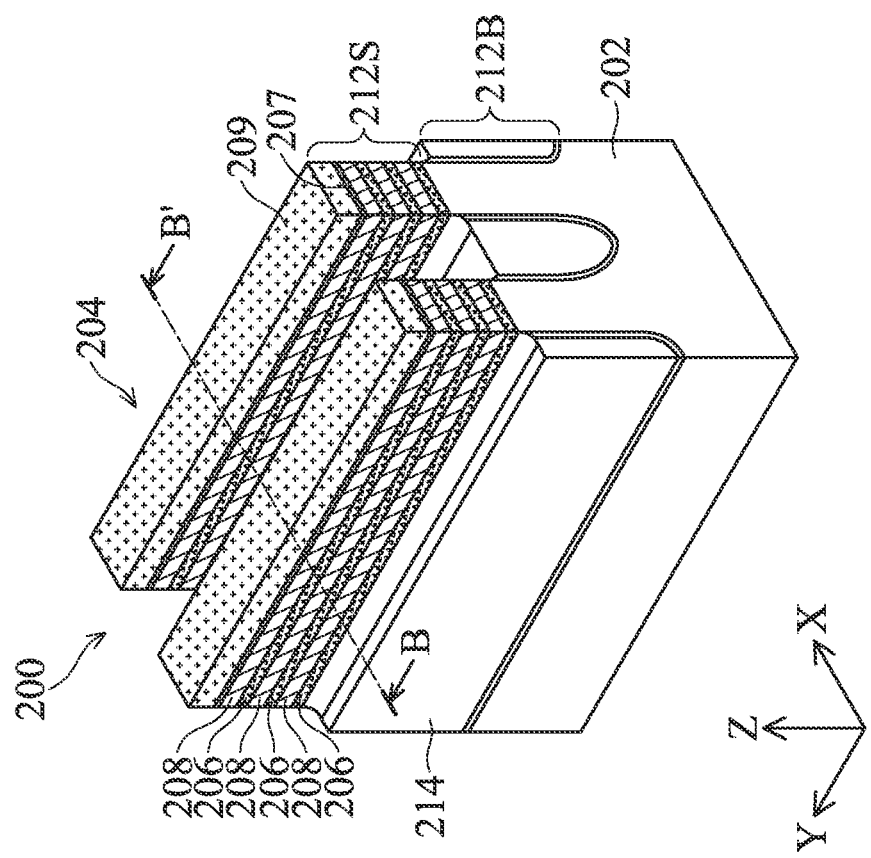
FIGS. 1A, 2A, 3A, 4A, 5A, 6A, 7A, 8A, 9A, and 10A illustrate three dimensional views of an example workpiece of the present disclosure at various fabrication stages according to various aspects of the present disclosure.

Referring to FIGS. 1A, 1B, and to block 102 of method 100, a workpiece 200 is received (or provided). The workpiece 200 includes a substrate 202 and a stack of semiconductor layers 204 disposed on the substrate 202. In some embodiments, the substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure or a germanium-on-insulator (GOI) structure. In some embodiments, the substrate 202 may include one or more well regions, such as n-type well regions doped with an n-type dopant (i.e., phosphorus (P) or arsenic (As)) or p-type well regions doped with a p-type dopant (i.e., boron (B)), for forming different types of devices. The doping the n-type wells and the p-type wells may be formed using ion implantation or thermal diffusion.

The stack of semiconductor layers 204 may include a plurality of channel layers 208 interleaved (or interweaved) by a plurality of sacrificial layers 206. The channel layers 208 and the sacrificial layers 206 may have different semiconductor compositions. In some implementations, the channel layers 208 are formed of silicon (Si), such as crystalline Si, and sacrificial layers 206 are formed of silicon germanium (SiGe). In these implementations, the additional germanium content in the sacrificial layers 206 allow selective removal or recess of the sacrificial layers 206 without substantial damages to the channel layers 208. In some embodiments, the sacrificial layers 206 and channel layers 208 may be deposited using an epitaxial process. The stack of semiconductor layers 204 may be epitaxially deposited using Chemical Vapor Deposition (CVD) techniques (e.g., vapor-phase epitaxy (VPE) and/or ultra-high vacuum CVD (UHV-CVD)), molecular beam epitaxy (MBE), and/or other suitable processes. The sacrificial layers 206 and the channel layers 208 are deposited alternatingly, one-after-another, to form the stack 204. For patterning purposes, the workpiece 200 may also include hard mask layers 209 over the stack 204. The hard mask layers 209 may be a single layer or a multilayer. In some embodiments, the hard mask layers 209 are formed of silicon nitride. As described later, the hard mask layers 209 also protects the channel layers in subsequent etching operations. In some embodiments, additional pad oxide layer 207 may be optionally formed between the hard mask layer 209 and the topmost channel layers 208.

In some embodiments, the channel layers 208 each have a thickness 402 of about 3 nm to about 15 nm, such as about 5 nm to about 10 nm. If the thickness 402 is too small, the migration of the charge carriers through the channel layers 208 may become the bottleneck that restricts the device performance. If the thickness 402 is too large, the gate may not effectively control all portions of the channel layers 208. The sacrificial layers 206 each have a thickness 404 of about 3 nm to about 15 nm, such as about 5 nm to about 10 nm. If the thickness 404 is too small, there may not be sufficient space to subsequently form all necessary gate layers between adjacent channel layers 208. If the thickness 404 is too large, any additional benefit is offset by the extra processing and material costs. It is noted that three (3) layers of the sacrificial layers 206 and four (4) layers of the channel layers 208 are alternately and vertically arranged as illustrated in FIGS. 1A and 1B, which are for illustrative purposes only and not intended to be limiting. The number of layers depends on the desired number of channels for the semiconductor device. In some embodiments, the number of the channel layers 208 is between 2 and 10. The distance between a top surface of a topmost channel layer 208 and a bottom surface of a bottommost channel layer 208 (or a top surface of the substrate 202) may also be referred to as a stack height 412. The stack height is determined by the number of channel layers 208, the thickness(es) of the channel layers, the number of sacrificial layers 206, and the thickness(es) of the sacrificial layers. In some embodiments, the stack height 412 may be about 35 nm to about 65 nm. If the stack height is too small, such as less than 35 nm, there may be insufficient number or thickness of channel layers 208 to be formed in the transistor, such that the conductive path for the operation current may be unnecessarily restricted. If the stack height is too large, such as greater than 65 nm, the additional layers and/or the greater thickness may not sufficiently justify their fabrication cost and/or the physical space they occupy.

In some embodiments, the hard mask layers 209 (or collectively with the pad oxide layers 207, if present) have a thickness 414. As described later, the thickness 414 determines the height of a subsequently formed high-k hard mask layer, which forms part of the cut-metal-gate dielectric feature. In some embodiments, the thickness 414 may be about 10 nm to about 40 nm, such as about 15 nm to about 30 nm. If the thickness 414 is too small, such as less than about 10 nm, the subsequently formed cut-metal-gate dielectric feature may not be sufficient height to cut through the height of the gate structure. Conversely, if the thickness 414 is too large, such as greater than about 40 nm, the additional height does not bring substantial benefit yet occupies valuable device space.

Still referring to FIGS. 1A and 1B, the stack of semiconductor layers 204 and the substrate 202 immediately therebeneath have been patterned to form fin-shaped structure 212 (interchangeable referred to as active regions 212 or fin-active regions 212) using a patterning operation. Each of the fin-shaped structures 212 includes a base portion 212B formed from a portion of the substrate 202 and a stack portion 212S formed from the stack 204. The stack portion 212S is disposed over the base portion 212B. The fin-shaped structures 212 extend lengthwise along the Y-direction and extend vertically along the Z-direction upwards from the substrate 202. The fin-shaped structures 212 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structures 212 by etching the stack 204 and the substrate 202. The etching process can include dry etching, wet etching, reactive ion etching (RIE), and/or other suitable processes. In some embodiments, additional hard mask layers (such as oxide hard mask layer) may have been formed on top of the hard mask layer 209 prior to the patterning of the fin-shaped structures (such as prior to forming the mandrels). Those additional hard mask layers are removed following the completion of the patterning process. In some embodiments, the fin-shaped structures 212 are configured to have a width 408 along the X-direction. In some embodiments, the width 408 may be about 20 nm to about 40 nm.

The workpiece 200 further includes an isolation feature 214 formed between the adjacent fin-shaped structures 212. The isolation feature 214 may be formed by first depositing a precursor layer over the workpiece 200 and filling spaces (or trenches) between the fin-shaped structures 212 and subsequently recessed to expose at least the top portions of the fin-shaped structures 212. The dielectric material may include silicon oxide, silicon nitride, silicon oxynitride, fluorine-doped silicate glass (FSG), a low-k dielectric, combinations thereof, and/or other suitable materials. In various examples, the dielectric material may be deposited by a CVD process, a subatmospheric CVD (SACVD) process, a flowable CVD (FCVD) process, an ALD process, spin-on coating, and/or other suitable process. In some embodiments, a liner may be formed to wrap around the fin-shaped structures 212 prior to the formation of the isolation feature 214. Accordingly, as shown in FIGS. 1A and 1B, the stack portions 212S of the fin-shaped structures 212 rise above the isolation feature 214 while the base portions 212B are surrounded by the isolation feature 214. In some embodiments, the stack portions 212S have a height of about 45 nm to about 60 nm. If the height is too small, such as less than about 45 nm, the current passage through the channel layers may be limited; while if the height is too large, such as greater than about 60 nm, the additional chip footprint may not justify any performance improvements.

Figure 2B:
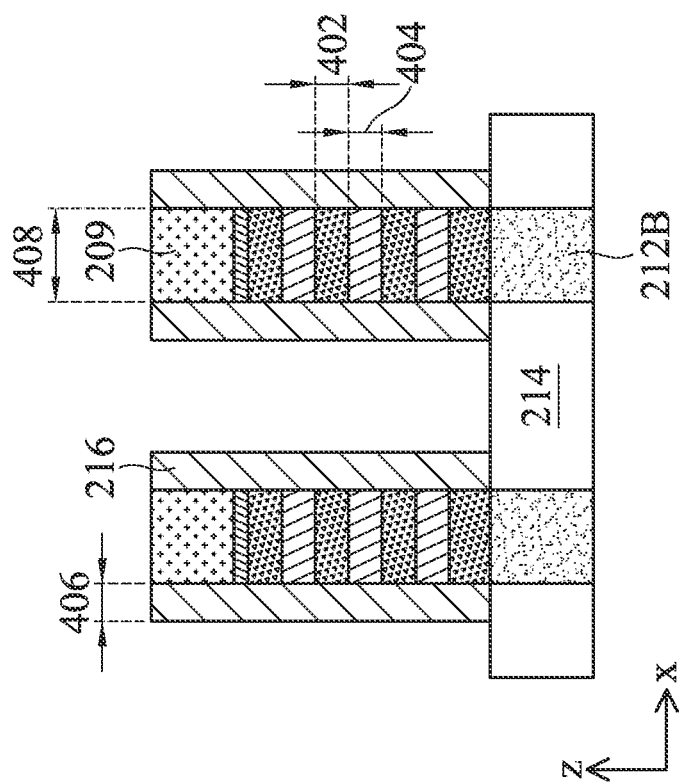
Figure 2A:
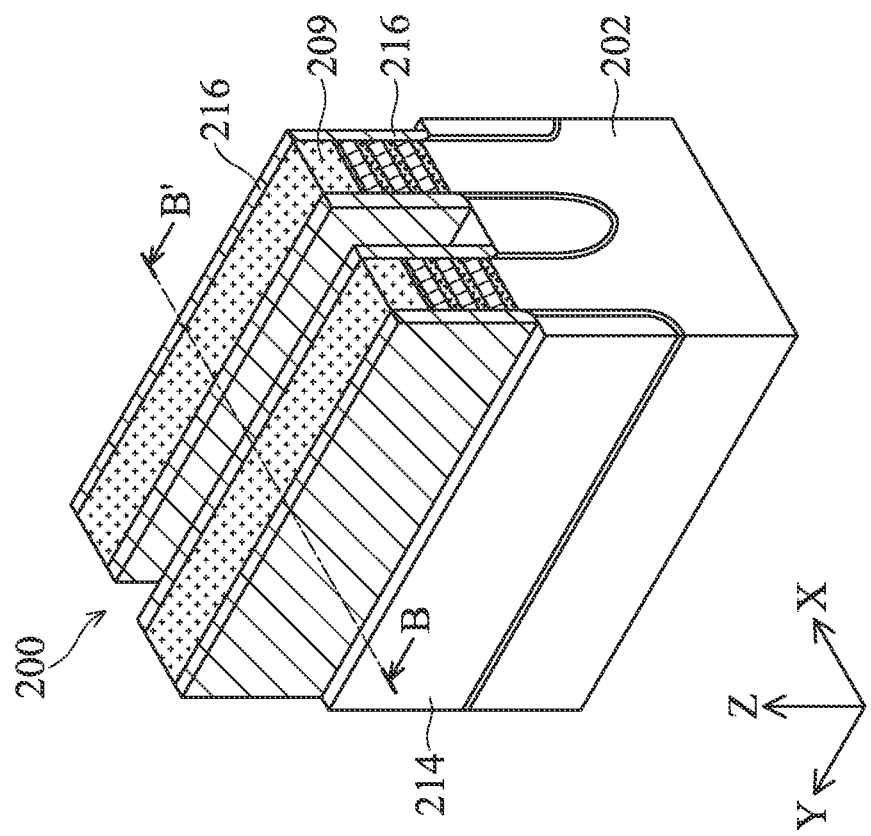

Referring to FIGS. 2A and 2B, method 100 includes a block 104 where a cladding layer 216 is formed over the fin-shaped structures 212. In some embodiments, the cladding layer 216 may have a composition similar to, but different from, that of the sacrificial layers 206. In one example, the cladding layer 216 may be formed of silicon germanium (SiGe), and the sacrificial layers 206 is also formed of SiGe. This common composition allows efficient selective removal of the sacrificial layers 206 and the cladding layer 216 without adversely affect the channel layers 208 (such as formed of Si) in a subsequent process (such as a gate replacement process described below). However, the cladding layer 216 is also configured to achieve an etching selectivity from the sacrificial layers 206 under another etching condition (such as the dielectric layer replacement process described below). For example, in some embodiments, the cladding layer 216 is formed of SiGe in an amorphous state, while the sacrificial layers 206 are formed of crystalline SiGe. For another example, the cladding layer 216 may have a different Ge atomic percentage than that of the sacrificial layers 206. For instance, the cladding layer 216 may include a Ge atomic percentage of about 15% to about 25%; while the sacrificial layer 206 may include a Ge atomic percentage of about 20% to about 30%. In furtherance of this instance, the cladding layer 216 may include a Ge atomic percentage of less than about 22.5%; while the sacrificial layer 206 may include a Ge atomic percentage of greater than about 22.5%. In some embodiments, the cladding layer 216 may be conformally and epitaxially grown using VPE or MBE. In some alternative embodiments, the cladding layer 216 may be deposited using CVD, ALD, other suitable deposition method, or combinations thereof. As shown in FIGS. 2A and 2B, the cladding layer 216 is selectively disposed on sidewalls of the fin-shaped structures 212. The cladding layer 216 has a thickness 406. In some embodiments, the thickness 406 is about 2 nm to about 20 nm, for example, about 5 nm to about 15 nm. As described later, the thickness 406 determines the width of a subsequently formed trench in which a dielectric material is deposited. If the thickness 406 is too small, it may be challenging to fully fill the subsequently formed trench. If the thickness is too large, the additional benefit may not justify the chip footprint it requires.

Figure 3B:
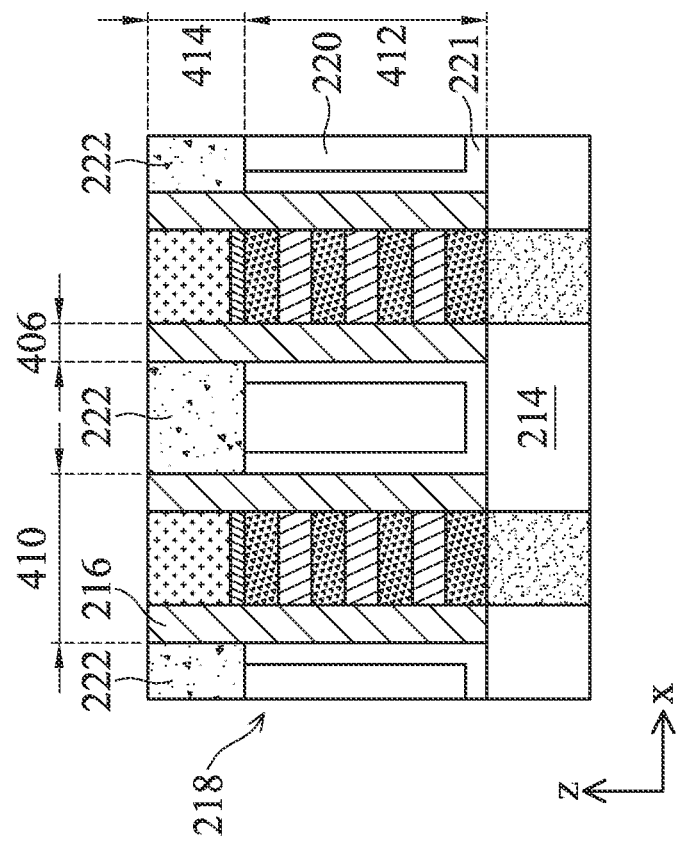
Figure 3A:
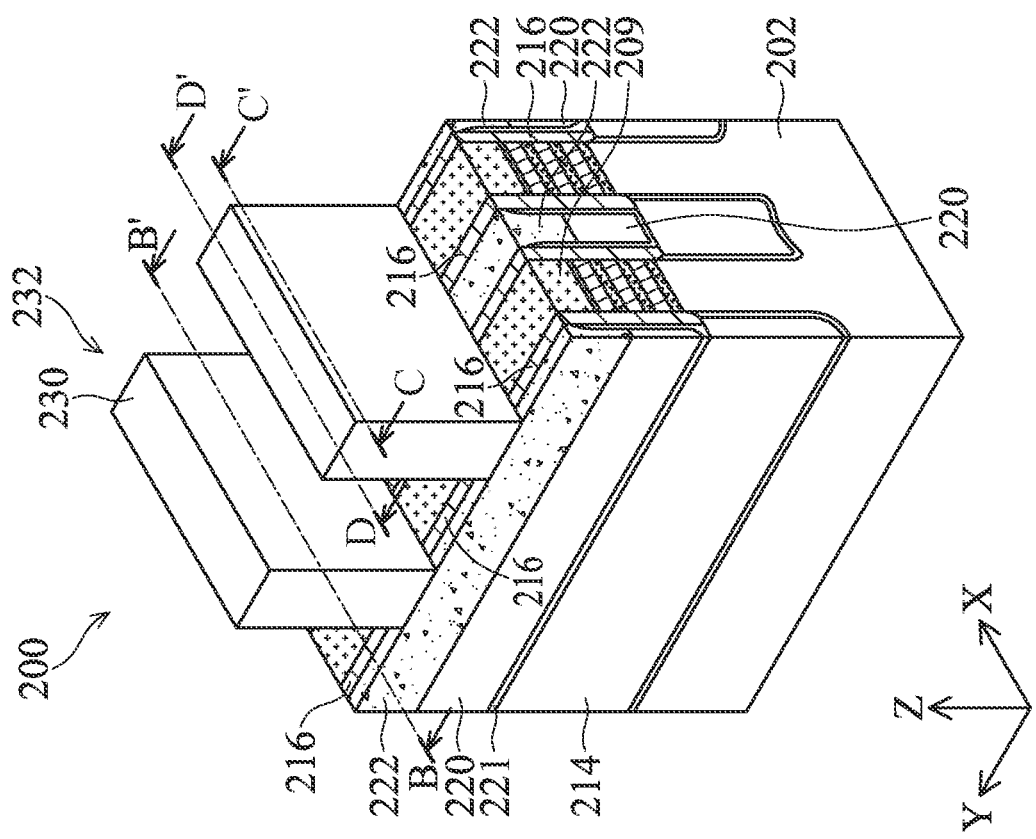

Referring to FIGS. 3A and 3B, method 100 includes a block 106 where a dielectric feature 218 (or dielectric barrier 218) is formed between adjacent fin-shaped structures 212. In some embodiments, the dielectric features 218 separate adjacent fin structures 212 and in some instances define lengths of subsequently formed gate structures. Dielectric features 218 are sometimes implemented in cut-metal-gate (CMG) processes. The dielectric feature 218 may include multiple layers. For example, in the depicted embodiments, a filler layer 220 is deposited over the workpiece 200. In some embodiments, a composition of the filler layer 220 may be similar to a composition of the isolation feature 214. In some embodiments, the filler layer 220 may be deposited using a CVD process, an SACVD process, an FCVD process, an ALD process, a PVD process, spin-on coating, and/or other suitable process. The workpiece 200 is then planarized. In some embodiments, the workpiece 200 is planarized using a CMP process until top surfaces of the hard mask layer 209 are exposed. In some embodiments, another layer 221 is formed conformally prior to the deposition of the filler layer 220 such that it interposes between the filler layer 220 and the cladding layer 216, as well as between the filler layer 220 and the isolation feature 214. Moreover, in some embodiments, the filler layer 220 is recessed, such that a top surface of the filler layer extends below a top surface of the hard mask layer 209. In some embodiments, the top surface of the recessed filler layer 220 is below the top surface of the topmost channel layer 208 by about 4 nm to about 45 nm. Subsequently, a dielectric layer 222 is formed over the recessed filler layer 220, on the top surface of the hard mask layer 209, and on the top surface of the cladding layer 216. The dielectric layer 222 may be formed of high-k dielectric materials, and may be interchangeably referred to as the high-k dielectric layer 222 or high-k hard mask layer 222. As used herein, high-k dielectric materials include dielectric materials having a high dielectric constant, for example, greater than that of thermal silicon oxide (~3.9). The dielectric layer 222 may include hafnium oxide. Alternatively, the dielectric layer 222 may include other high-k dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HfTiO), $(Ba,Sr)TiO_3$ (BST), silicon nitride (SiN), silicon oxynitride (SiON), combinations thereof, or other suitable material. In some embodiments, a CMP process is conducted to remove excess materials and to expose a top surface of the hard mask layer 209. At this processing stage, the recessed filler layer 220, the layer 221, and the dielectric layer 222 collectively form the dielectric feature 218 that isolates fin-shaped structures 212 from one another. As illustrated in FIG. 3B, sidewall surfaces of adjacent dielectric features 218 are spaced apart by a distance 410. The distance 410 equals to the sum of the width 408 and twice the thickness 406 (or interchangeable referred to as the width 406). As described in more detail below, the distance 410 determines the width of top portions of subsequently formed source/drain features, and therefore is interchangeably referred to as the width 410.

Figure 3D:
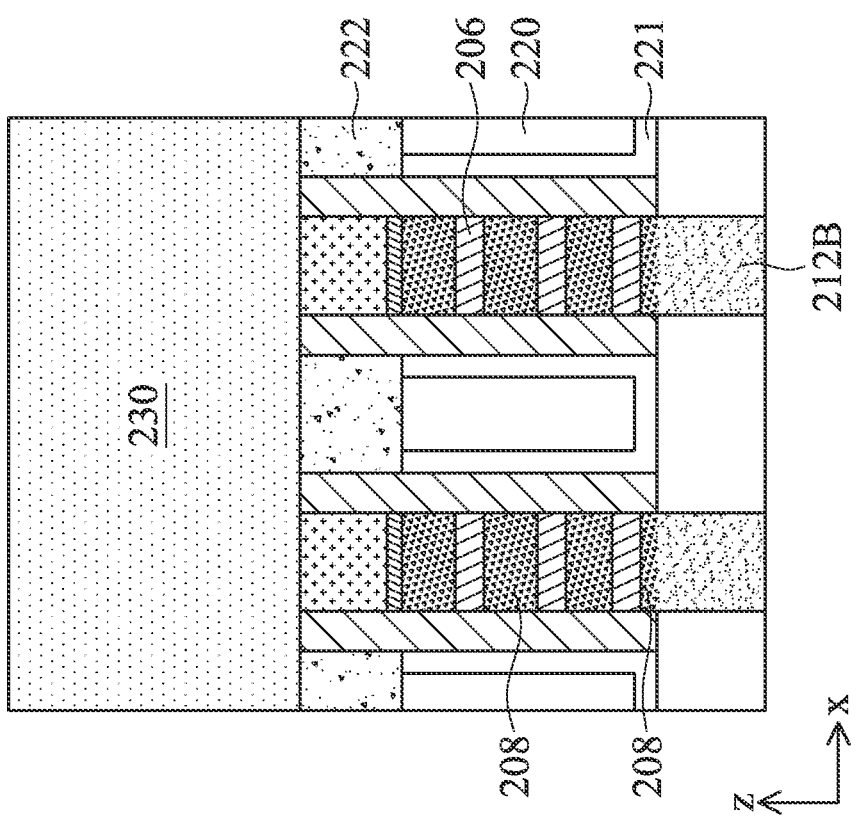
FIGS. 3D, 4D, 5D, 6D, 7D, 8D, 9D, and 10D illustrate fragmentary cross-sectional views of an example workpiece of the present disclosure along the line D-D' in FIGS. 3A, 4A, 5A, 6A, 7A, 8A, 9A, and 10A, respectively, according to various aspects of the present disclosure.
Figure 3C:
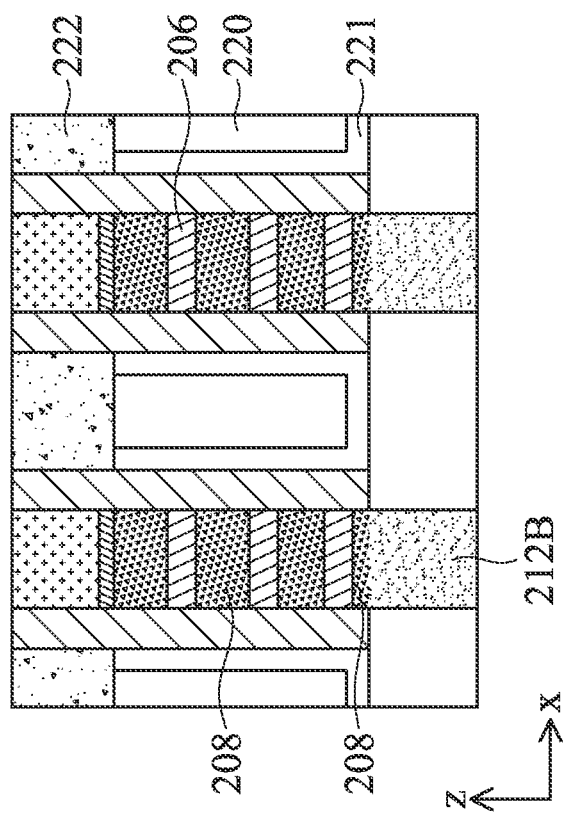
FIGS. 3C, 4C, 5C, 6C, 7C, 8C, 9C, and 10C illustrate fragmentary cross-sectional views of an example workpiece of the present disclosure along the line C-C' in FIGS. 3A, 4A, 5A, 6A, 7A, 8A, 9A, and 10A, respectively, according to various aspects of the present disclosure.

Still referring to FIGS. 3A and 3B, method 100 includes a block 108 where gate stacks 230 are formed on the fin-shaped structures 212. In some embodiments, the gate stacks 230 extend orthogonally to the lengthwise direction of the fin-shaped structures 212. For example, in the depicted embodiments, the gate stacks 230 extends along the X-direction. In some embodiments, a gate replacement process (or gate-last process) is later adopted where the gate stacks 230 serve as placeholders for subsequently formed functional gate structures (or metal gate). Accordingly, the gate stacks 230 may alternatively be referred to as the dummy gate stacks 230. Other processes and configuration are possible. The gate stacks 230 are formed on (and in some embodiments directly contacting) top surfaces of the dielectric layer 222, top surfaces of the hard mask layer 209, and directly contacting top surfaces of the cladding layers 216. Accordingly, as illustrated in FIG. 3D, portions of the cladding layer 216 are buried under the gate stacks 230. Meanwhile, as illustrated in FIG. 3C, portions of the cladding layers 216 are exposed in regions between adjacent gate stacks 230. Each of the gate stacks 230 includes a gate electrode (or a dummy gate electrode). In some embodiments, the gate stacks 230 may further include other layers such as gate dielectric layers, interfacial layers, other suitable layers or combinations thereof. Layers for the gate stacks 230 may be formed by any suitable methods, such as CVD. In some embodiments, a gate top hard mask (not shown) is deposited over the material layer for the gate electrode which assists the patterning of the gate electrode. The gate top hard mask may be a multi-layer and include a silicon nitride mask layer and a silicon oxide mask layer over the silicon nitride mask layer. The material layer for the gate electrodes is then patterned using photolithography processes to form the gate electrodes. In some embodiments, the gate electrodes may include polycrystalline silicon (polysilicon). In some embodiments, an oxide layer is formed interposing between the top surfaces of the topmost channel layer 208 and the gate stacks 230.

Figure 4B:
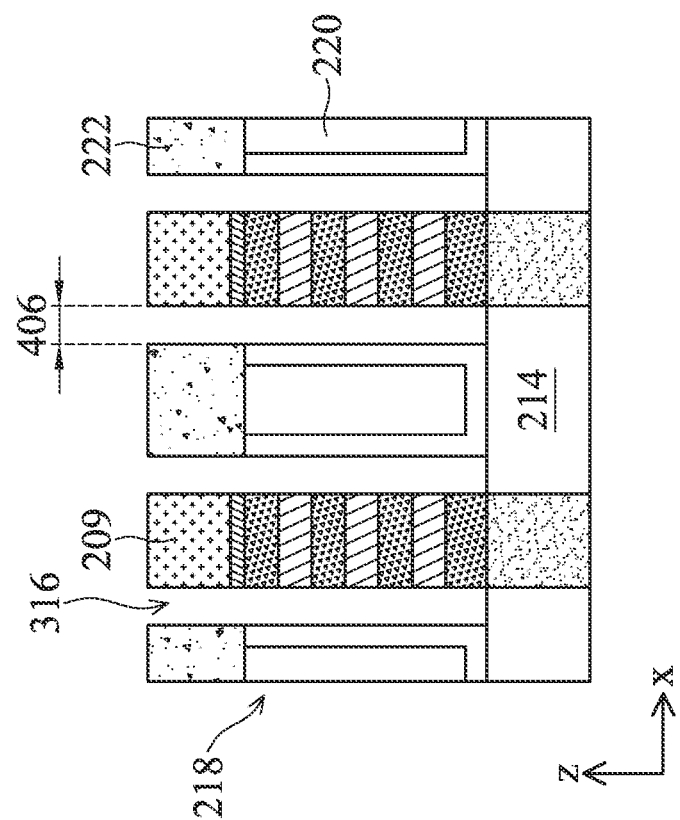
Figure 4A:
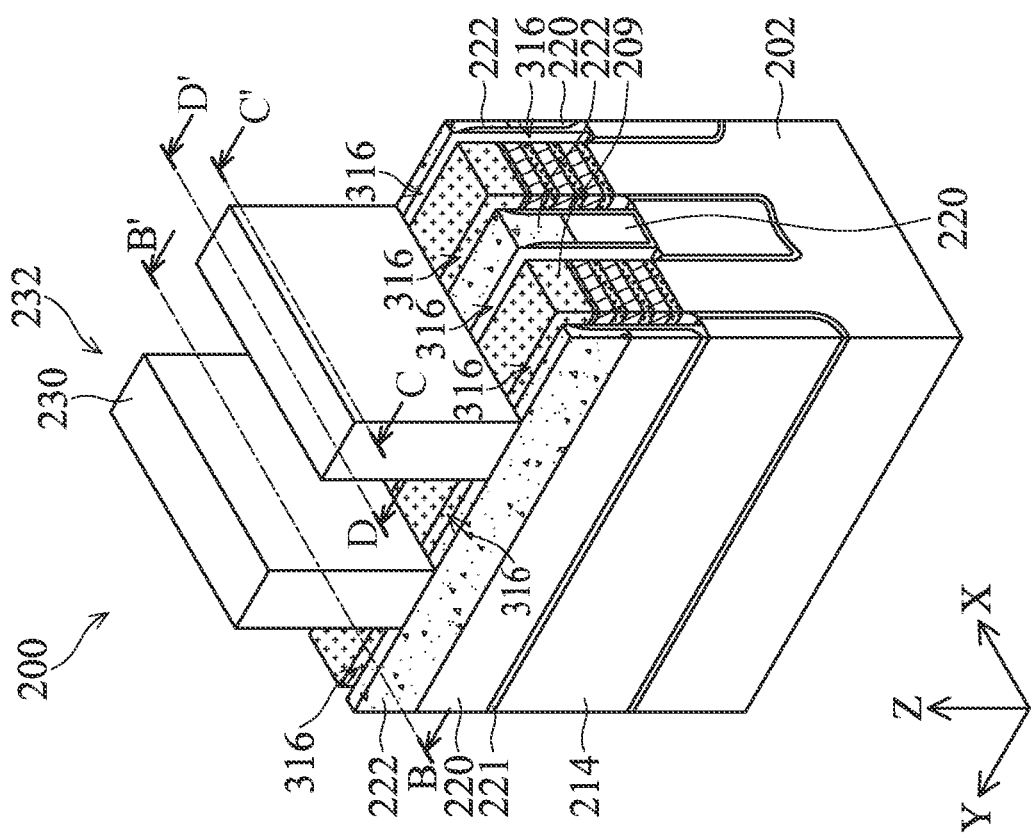
Figure 4D:
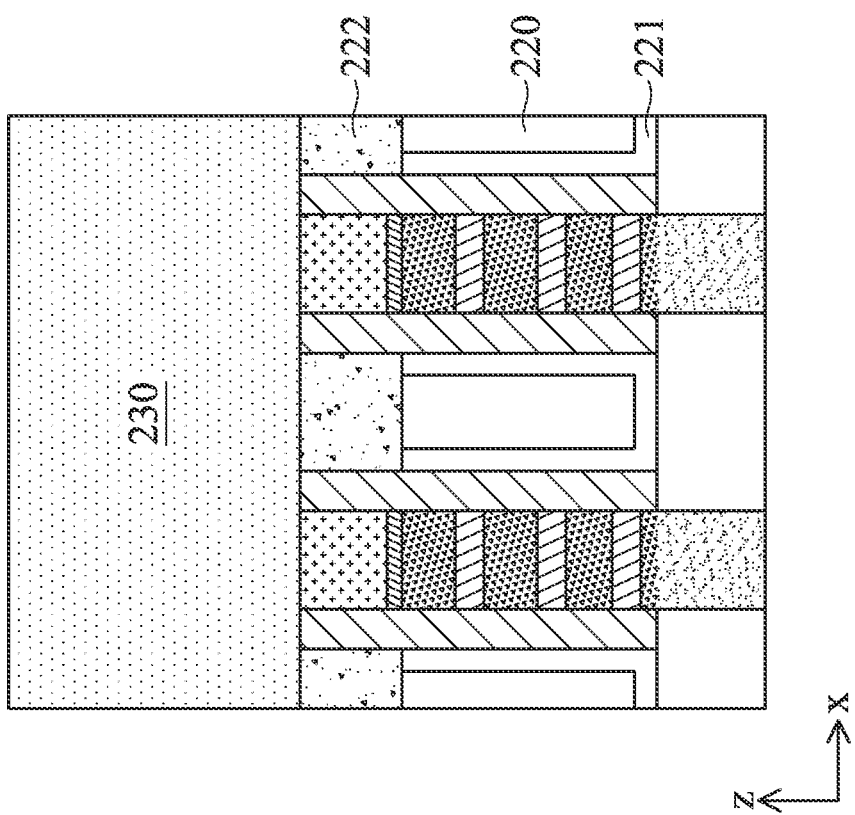
Figure 4C:
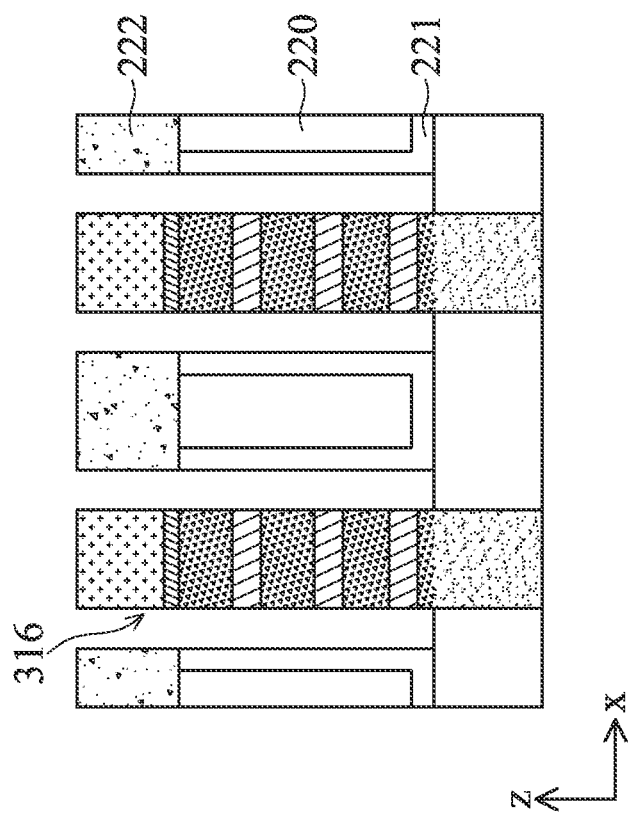

Referring to FIGS. 4A-4D, method 100 includes a block 110 of FIG. 12 where the cladding layer 216 between the dielectric feature 218 and the fin-shaped structures 212 are removed in a selective etching operation. In some embodiments, the selective etching operation is configured such that cladding layer 216 not covered by the gate stacks 230 is removed in its entirety without substantially etching the layer 221, the channel layers 208 or the sacrificial layers 206. Accordingly, trenches 316 are formed from the partial removal of the cladding layers 216. The trenches 316 have dimensions substantially similar to the dimensions of the cladding layer 216. For example, the trenches 316 may have a width 406 of about 5 nm to about 15 nm. The sidewall surfaces of the layer 221, sidewall surfaces of the channel layers 208, as well as the sidewall surfaces of the sacrificial layers 206 are exposed in trenches 316. Meanwhile, portions of the cladding layer 216 covered under the gate stacks 230 remain intact, as illustrated in FIG. 4D.

Figure 5B:
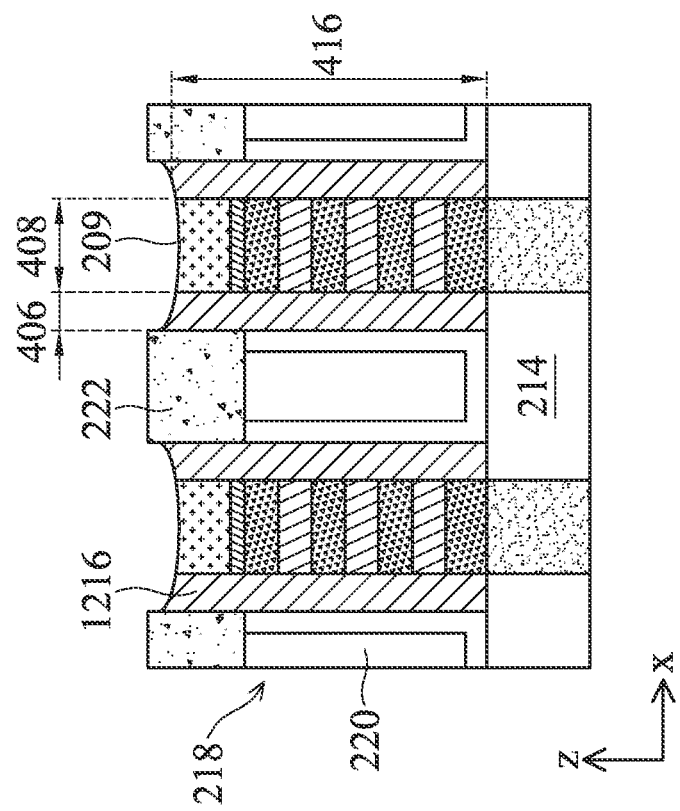
Figure 5A:
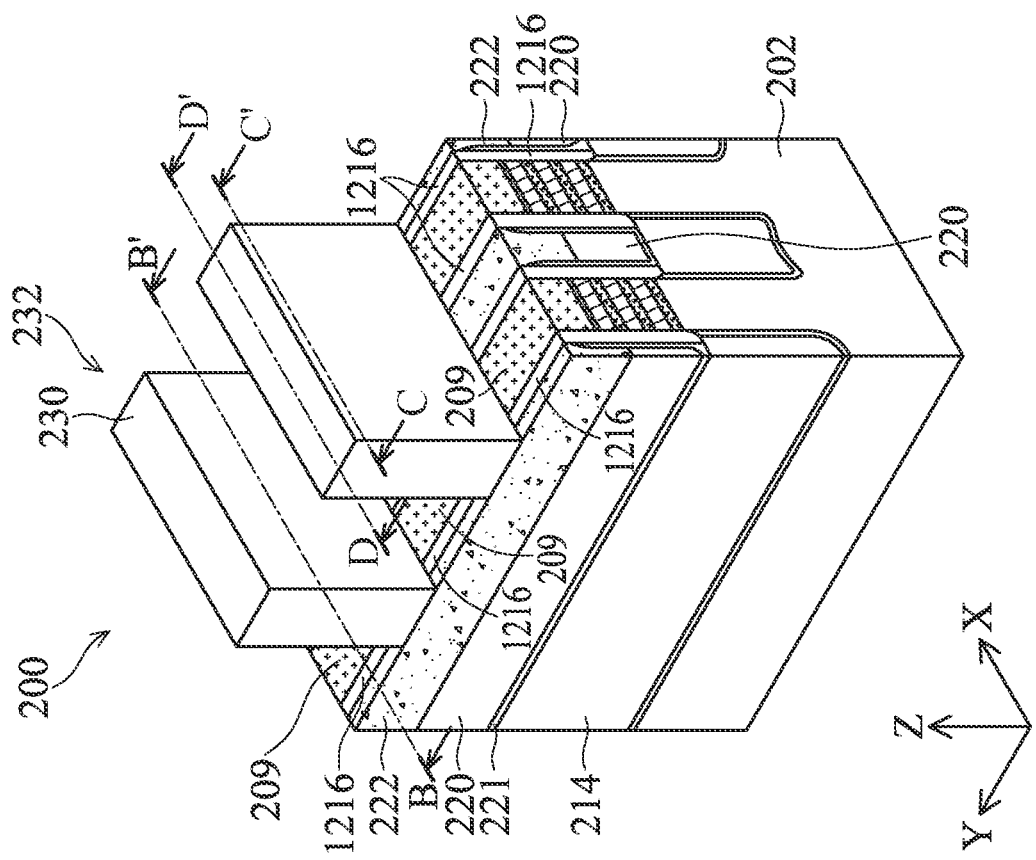
Figure 5D:
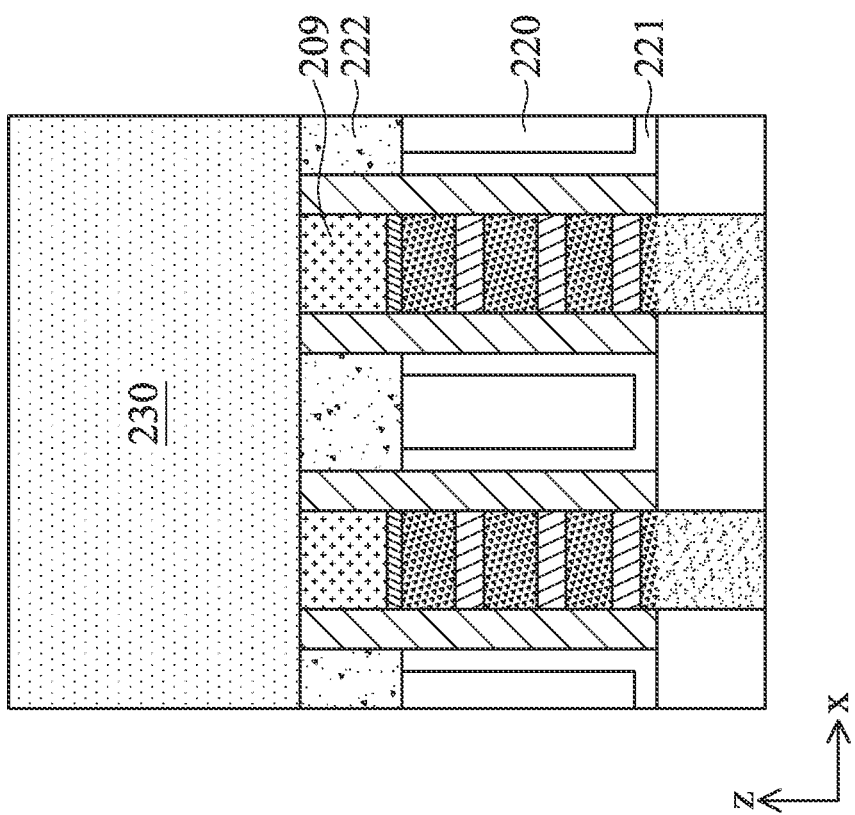
Figure 5C:
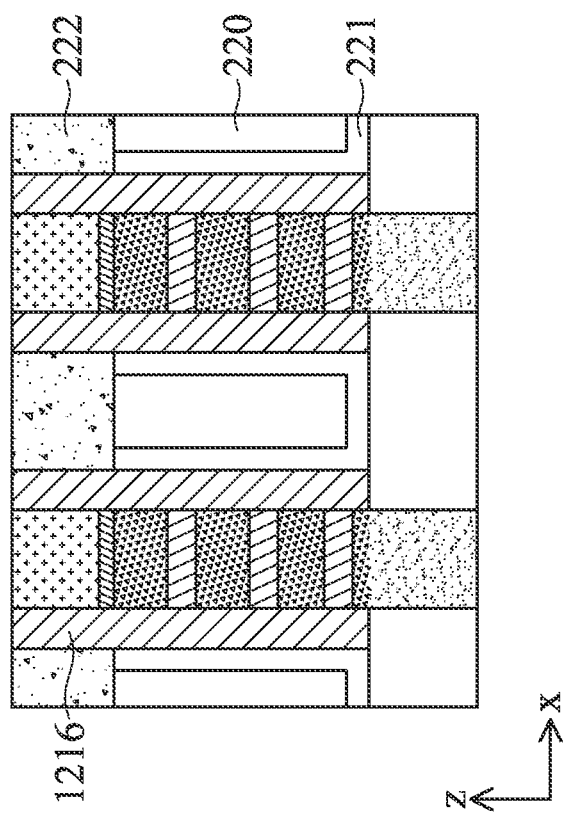
Figures 6A, 6B:
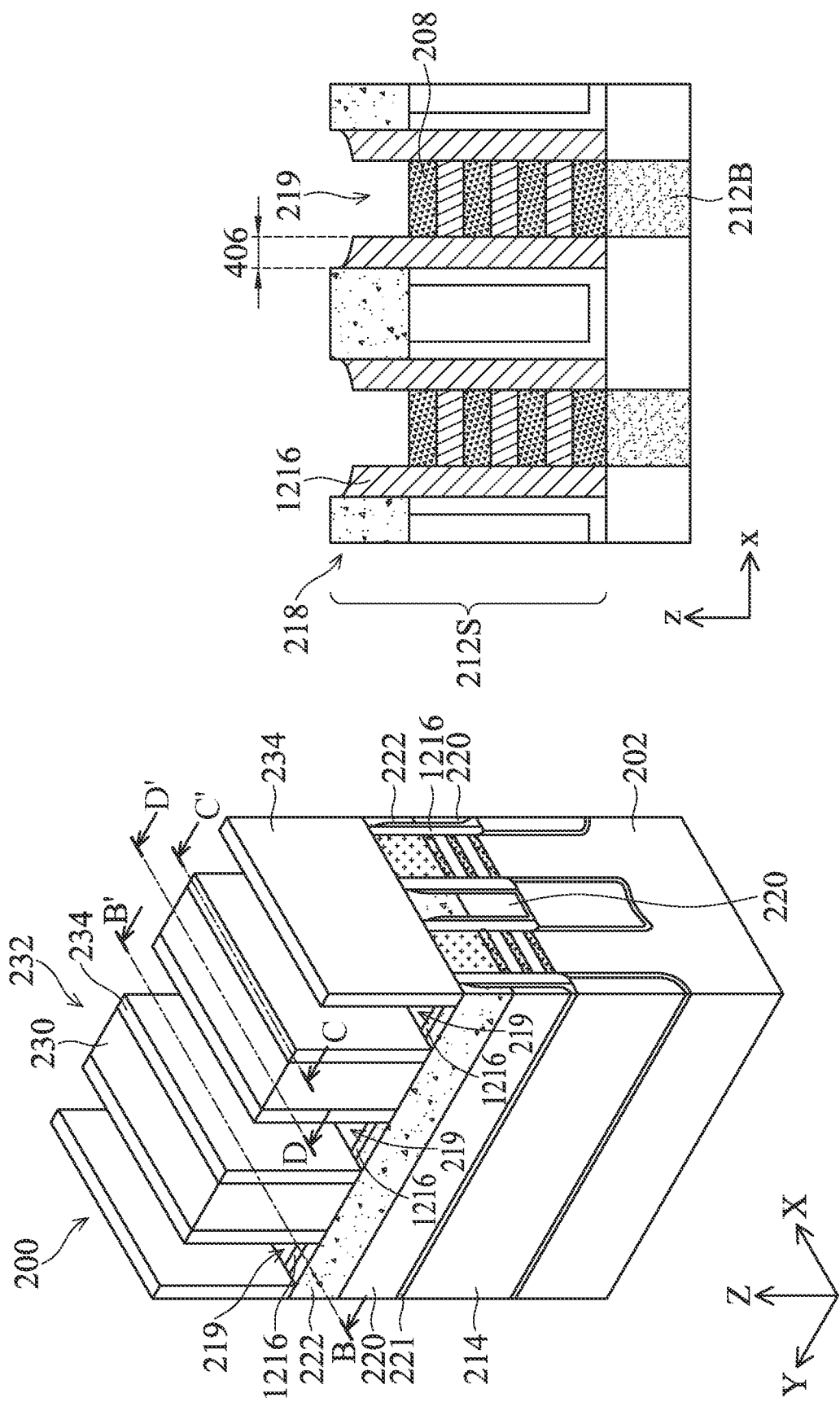
Figure 6D:
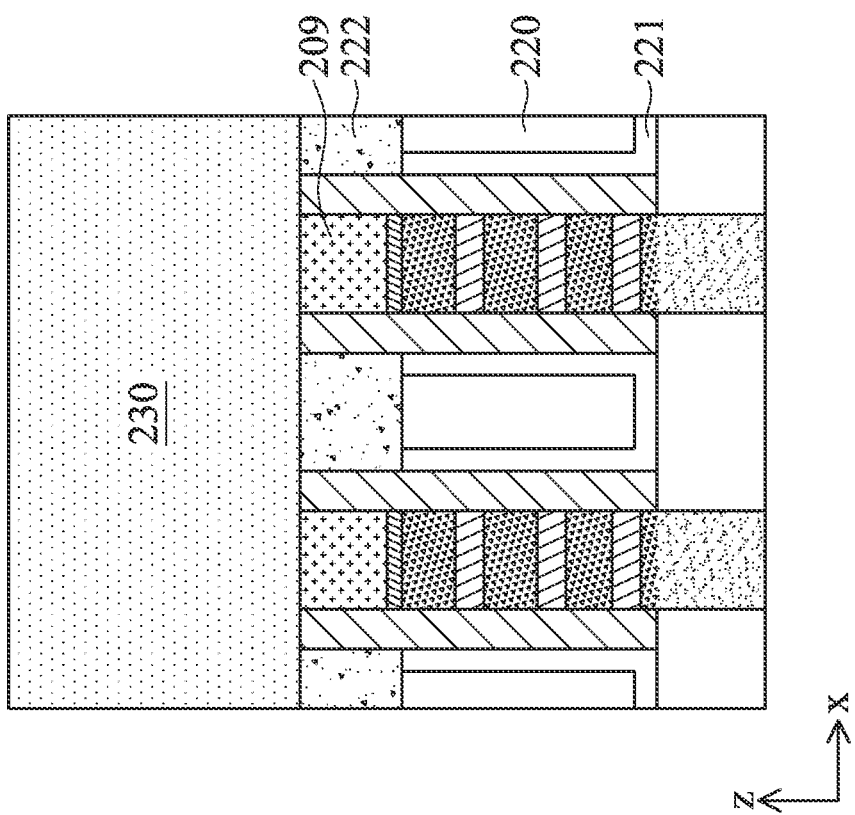
Figure 6C:
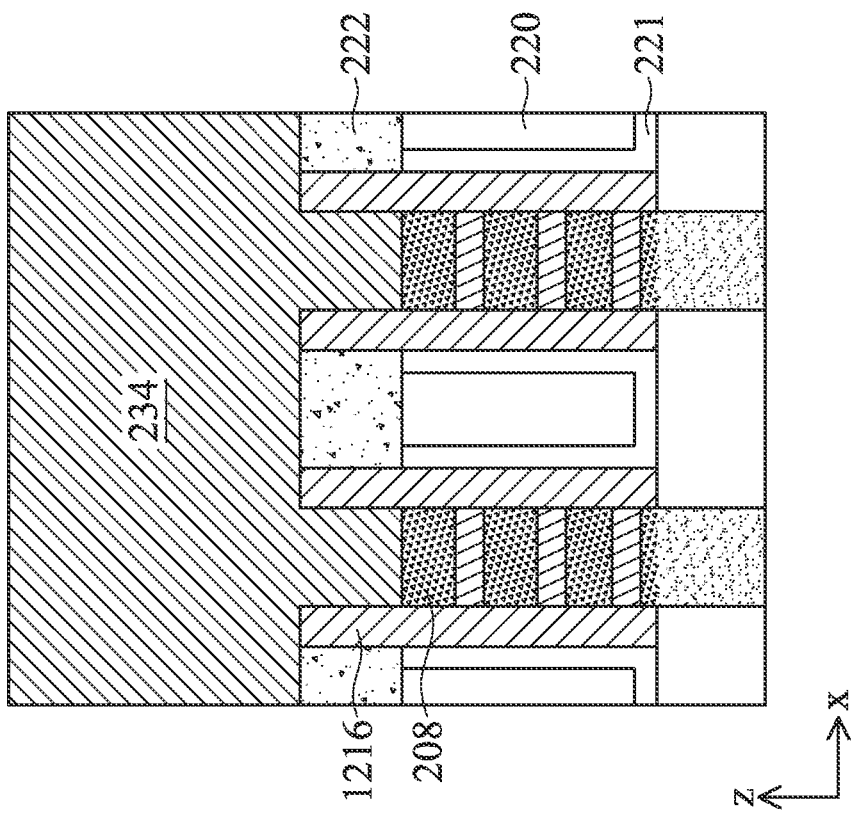

Referring to FIGS. 5A-5D and to block 112 of FIG. 12, a dielectric material is deposited into the trenches 316 to substantially fill the trenches 316, thereby forming the dielectric features 1216 (also referred to as the source/drain spacers). Accordingly, the dielectric features 1216 have the width 406. Moreover, because the dielectric features 1216 are formed on both ends of the fin-shaped structures 212, sidewall surfaces of adjacent dielectric features 1216 are spaced apart by the width 408 (alternatively and interchangeably referred to as the distance 408). As described below, in some embodiments, the distance 408 defines the dimension of lower portions of subsequently formed source/drain features. The dielectric material may be selected based on at least the etching resistance against subsequently used etching conditions. For example, in some embodiments, the dielectric material may serve the function of a spacer between the gate structure and the epitaxial source/drain features. For example, the dielectric material may be configured to resist etching conditions employed in source/drain trenches formation, channel releases (or sheet formations), and contact trench etching operations. Accordingly, the dielectric material protects the subsequently formed source/drain features and prevents gate-to-source/drain shorting or leakage. In some embodiments, the dielectric material includes a low-k dielectric material. For example, the dielectric material may include silicon carbonitride (SiCN), silicon carboxynitride (SiCON), silicon carbide (SiC), other suitable dielectric materials, or combinations thereof. The deposition of the dielectric material may implement any suitable deposition techniques, such as Physical Vapor Deposition (PVD), Chemical Vapor Deposition (CVD), Atomic Layer Deposition (ALD), other suitable deposition techniques, or combinations thereof. In some embodiments, the dielectric material is initially formed over top surfaces of the dielectric layer 222, over the top surfaces of the hard mask layers 209, as well as on sidewall surfaces of the gate stacks 230. Subsequently, an etching-back operation is conducted to remove the excess dielectric materials and to expose the top surfaces of the dielectric layer 222, and to expose sidewall surfaces of the gate stacks 230. Accordingly, as illustrated in FIG. 5B, remaining portions of the dielectric material becomes the dielectric features 1216, where the top surfaces of the dielectric feature 1216 are exposed. The dielectric features 1216 may each have a height 416 measured from a top surface of the substrate 202 (and a top surface of the isolation feature 214) to a top surface of the dielectric features 1216. In some embodiments, the CMP operation results in a concaved top surface of the dielectric features 1216 and the hard mask layer 209. In such embodiments, the height 416 refers to heights of the dielectric feature 1216 averaged across its width dimension along the X-direction. In the depicted embodiments, the top surfaces of the dielectric features 1216 extend below a top surface of the dielectric features 218 but above a top surface of the filler layer 220. In some embodiments, an etching operation is conducted at this processing stage to recess the dielectric features 1216. However, due to the restrictions of adjacent features, it may be challenging to regulate and fine tune the sizes of the dielectric features 1216. In the depicted embodiments, the height of the dielectric features 1216 are adjusted at a later processing stage, as described in more detail below.

During the etching-back operation, the hard mask layer 209 may be partially removed. For example, the top surfaces of the hard mask layer 209 may become concaved following the etching-back operation. The presence of the hard mask layers 209 protects the channel layers 208 therebeneath to not be compromised. Following the completion of the etching-back operation, referring to FIGS. 6A-6D, the exposed portions of the hard mask layer 209 are etched away selectively such that trenches 219 are formed. For example, the hard mask layer 209 (and the pad oxide layer 207, if present) is removed using a wet etching process without substantially affecting the channel layers 208 thereunderneath. In some embodiments, the etching operation may implement a dry etching, a wet etching, or combinations thereof. In some embodiments, the etching operation is configured to form a substantially right angle (about) 90° between sidewalls of the gate stack 230 and the top surface of the channel layer 208. This reduces formation of undesirable dielectric residues following a subsequent spacer deposition. Meanwhile, the hard mask layers 209 covered under the gate stacks 230 are substantially preserved. The trenches 219 are defined by the sidewall surfaces of the dielectric features 1216 along the X-direction, and by the planes along sidewall surfaces of the gate stacks 230 along the Y-direction. At this fabrication stage, the top surfaces of the channel layers 208 are exposed in the trenches 219. Moreover, gate spacers 234 are formed along sidewalls of the gate stacks 230. The gate spacers 234 may include one or more gate spacer layers. The gate spacer 234 may include a dielectric material, such as a dielectric material that allows selective removal of the gate stacks 230 without affecting the gate spacer 234. Suitable dielectric materials may include silicon nitride, silicon oxycarbonitride, silicon carbonitride, silicon oxide, silicon oxycarbide, silicon carbide, silicon oxynitride, and/or combinations thereof. The gate spacer 234 may be conformally deposited over the workpiece 200 using CVD, subatmospheric CVD (SACVD), ALD, other suitable methods, or combinations thereof. For example, the gate spacers 234 are formed on top and sidewall surfaces of the gate stacks 230. In the depicted embodiments, the gate spacers 234 extend into the trenches 219 and cover sidewall surfaces of the remaining portions of the hard mask layer 209, and are further formed on and directly contact the top surfaces of the topmost channel layers 208. Furthermore, the gate spacers 234 are formed on and directly contact the top surfaces of the dielectric features 1216, and on and directly contact the top surfaces of the dielectric layers 222. The gate stacks 230 and the gate spacers 234 collectively form gate structures 232.

Figures 7A, 7B:
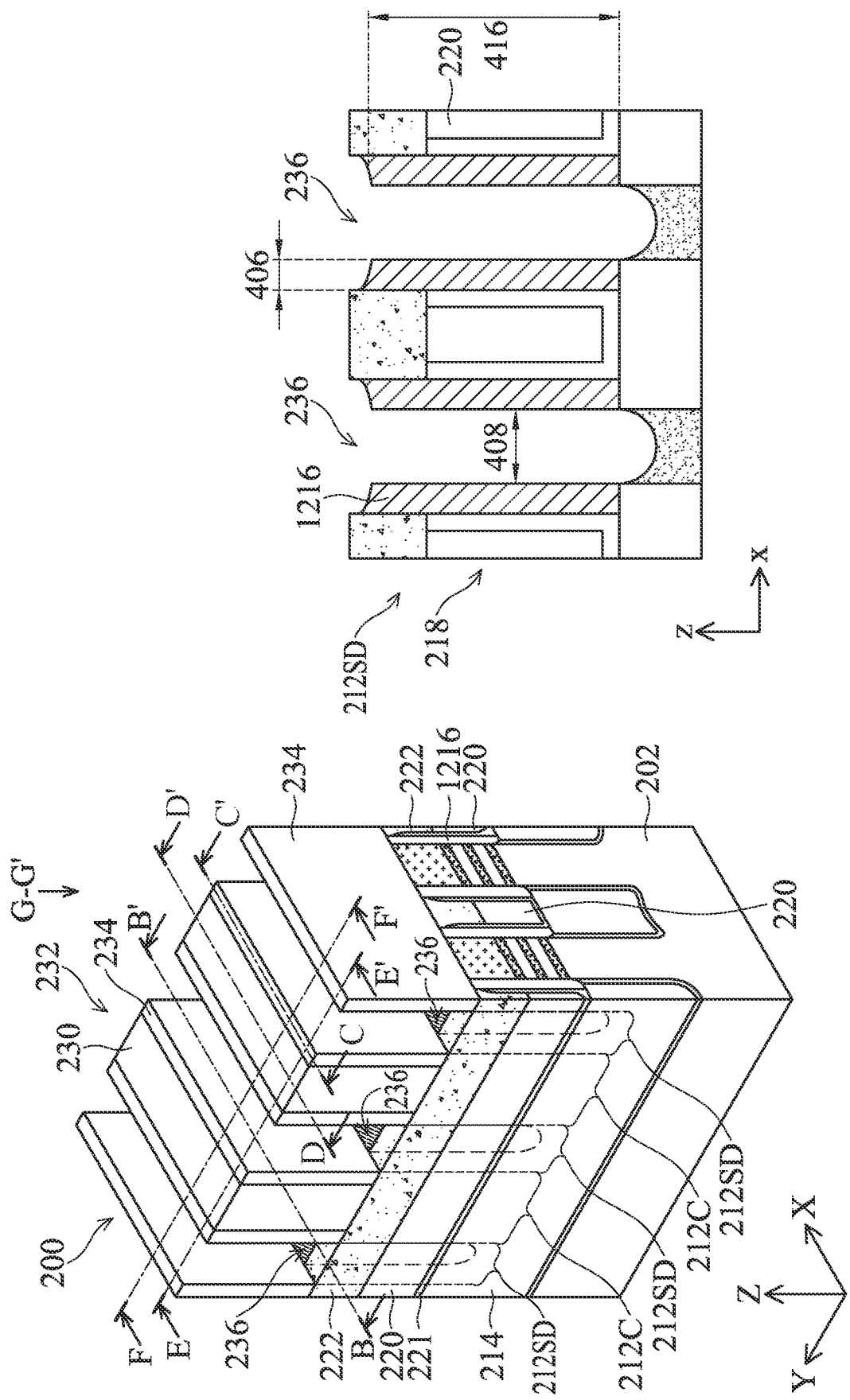
Figure 7D:
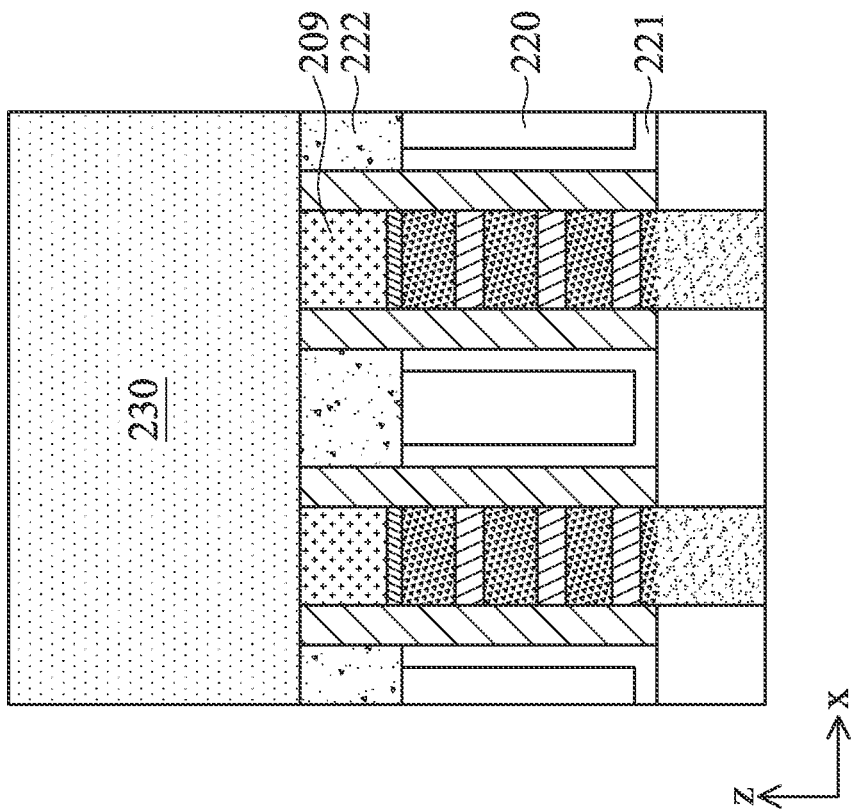
Figure 7C:
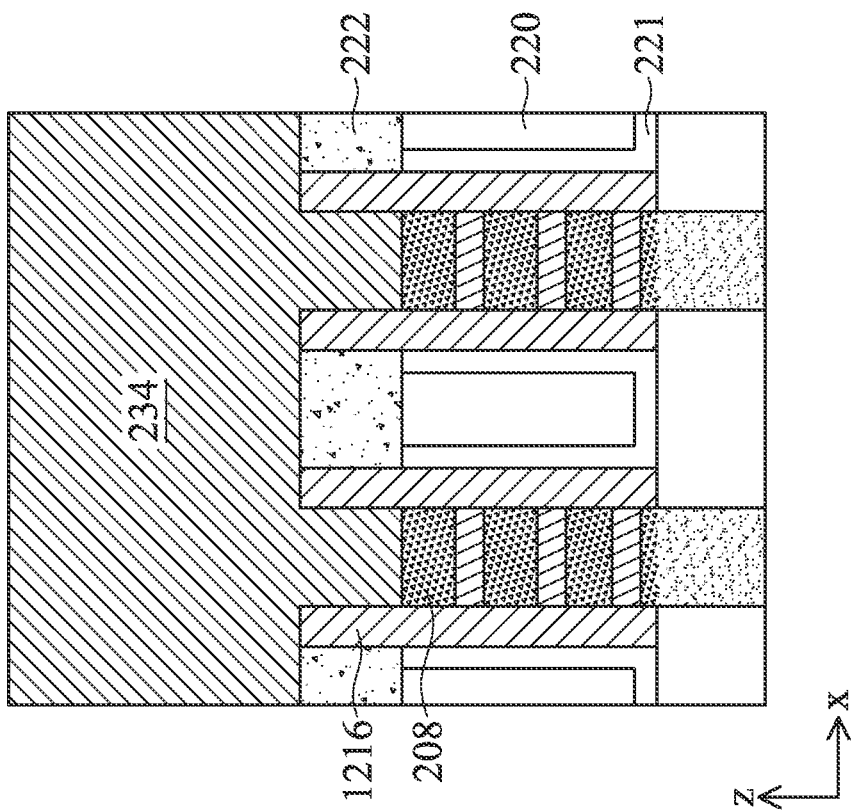
Figure 7F:
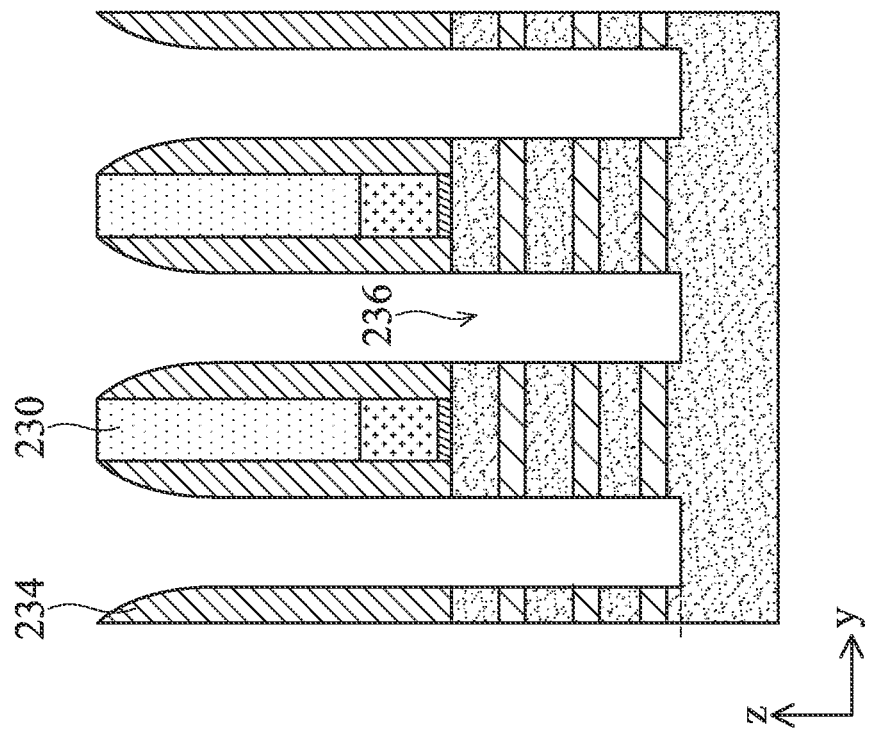
FIGS. 7F, 8F, 9F, and 10F illustrate fragmentary cross-sectional views of an example workpiece of the present disclosure along the line F-F' in FIGS. 7A, 8A, 9A, and 10A, respectively, according to various aspects of the present disclosure
Figure 7E:
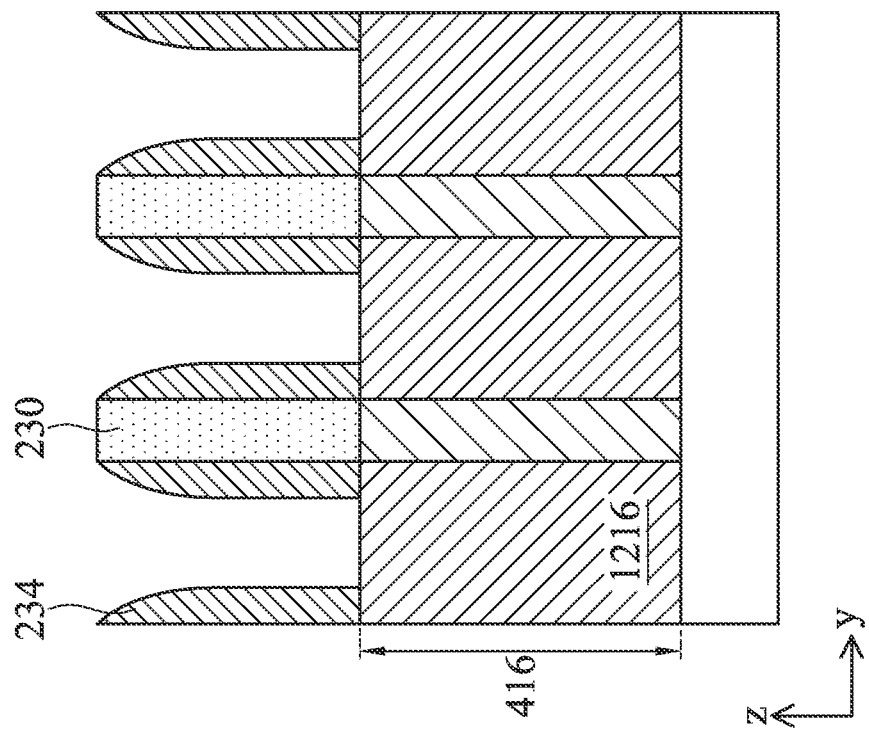
FIGS. 7E, 8E, 9E, and 10E illustrate fragmentary cross-sectional views of an example workpiece of the present disclosure along the line E-E' in FIGS. 7A, 8A, 9A, and 10A, respectively, according to various aspects of the present disclosure
Figure 7G:
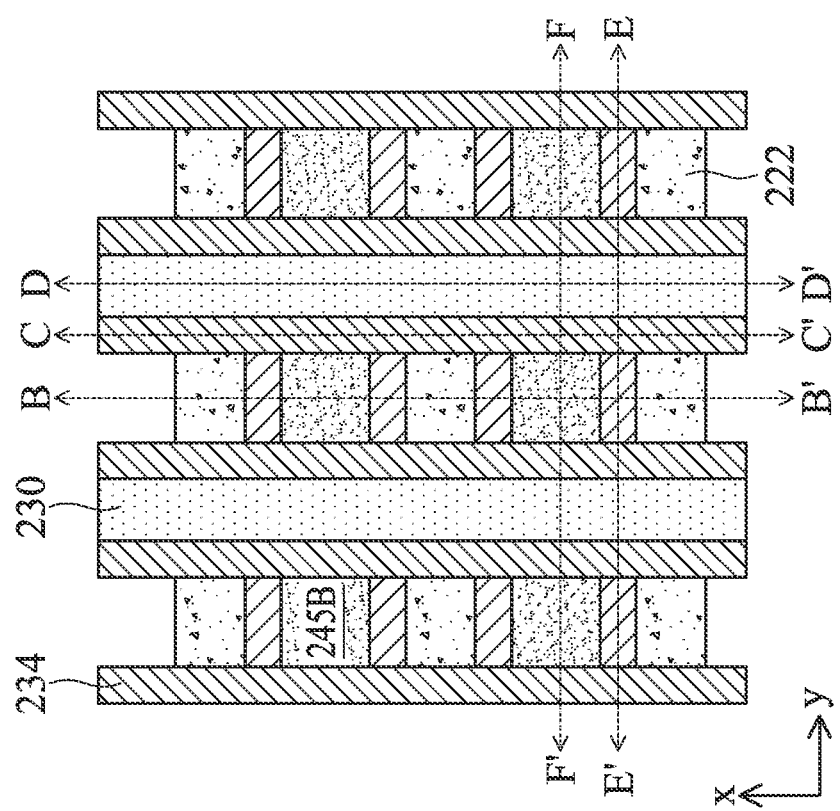
FIGS. 7G, 8G, 9G, and 10G illustrate fragmentary cross-sectional views of an example workpiece of the present disclosure along the line G-G' in FIGS. 7A, 8A, 9A, and 10A, respectively, according to various aspects of the present disclosure FIG. 11 illustrate fragmentary cross-sectional views of an example workpiece of the present disclosure according to various aspects of the present disclosure.

Referring to FIGS. 7A-7G and to block 114 of FIG. 12, the regions of the fin-shaped structures 212 underlying the gate structures 232 may be referred to as channel regions 212C. Each of the channel regions 212C in a fin-shaped structure 212 is horizontally sandwiched between two source/drain regions 212SD where source/drain features are subsequently formed. At this processing stage, the source/drain regions 212SD are recessed to form source/drain trenches 236. With the gate structures 232 serving as an etch mask, the workpiece 200 is anisotropically etched to form the source/drain trenches 236 in the source/drain regions 212SD. In some embodiments as illustrated in FIG. 7B, operations at block 114 may substantially remove the stack portions 212S of fin-shaped structures 212 in the source/drain regions 212SD, and the source/drain trenches 236 may extend into the base portions 212B, which is formed from the substrate 202 (compare FIG. 6B). The anisotropic etch at block 114 may include a dry etch process or a suitable etch process. For example, the dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. The anisotropic etch at block 114 may implement a mask element. In some embodiments, the mask element covers the dielectric features 1216 such that they are preserved during the anisotropic etch. Accordingly, the height 416 and width 406 of the dielectric features 1216 remains unchanged. Accordingly, the source/drain trenches 236 are defined by sidewall surfaces of the dielectric features 1216 across the X-direction, and defined by planes along sidewall surfaces of the gate spacers 234 across the Y-direction. For example, the source/drain trenches 236 have a width 408 across the X-direction. At this processing stage, the source/drain trenches 236 may have a substantially uniform width (width 408) throughout their respective height along the Z-direction. Moreover, the anisotropic etch produces new sidewall surfaces for the fin-shaped structures 212. Accordingly, new sidewall surfaces of the channel layers 208 and the sacrificial layers 206 are now exposed in the source/drain trenches 236 (see FIG. 7F).

Figures 8A, 8B:
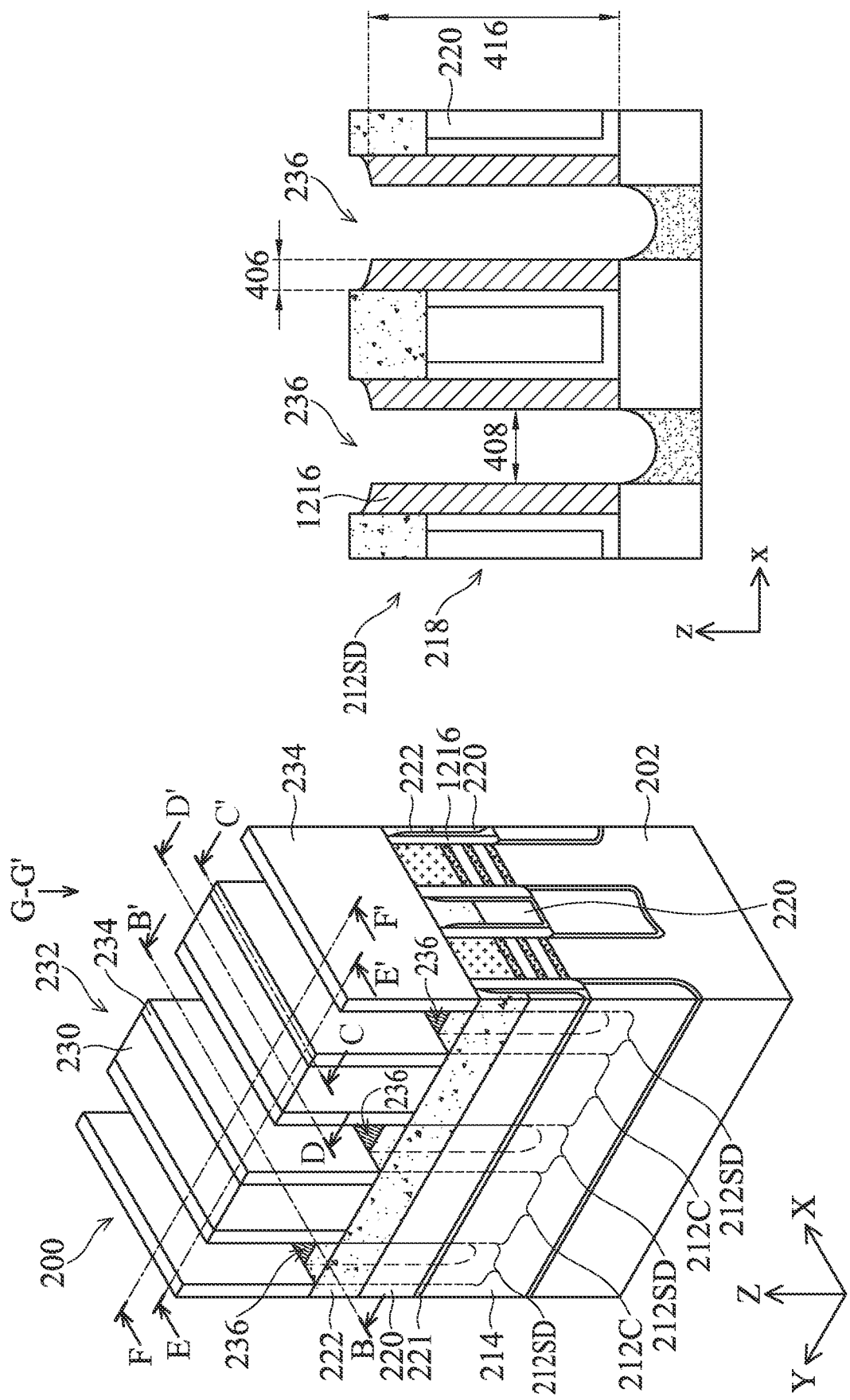
Figure 8D:
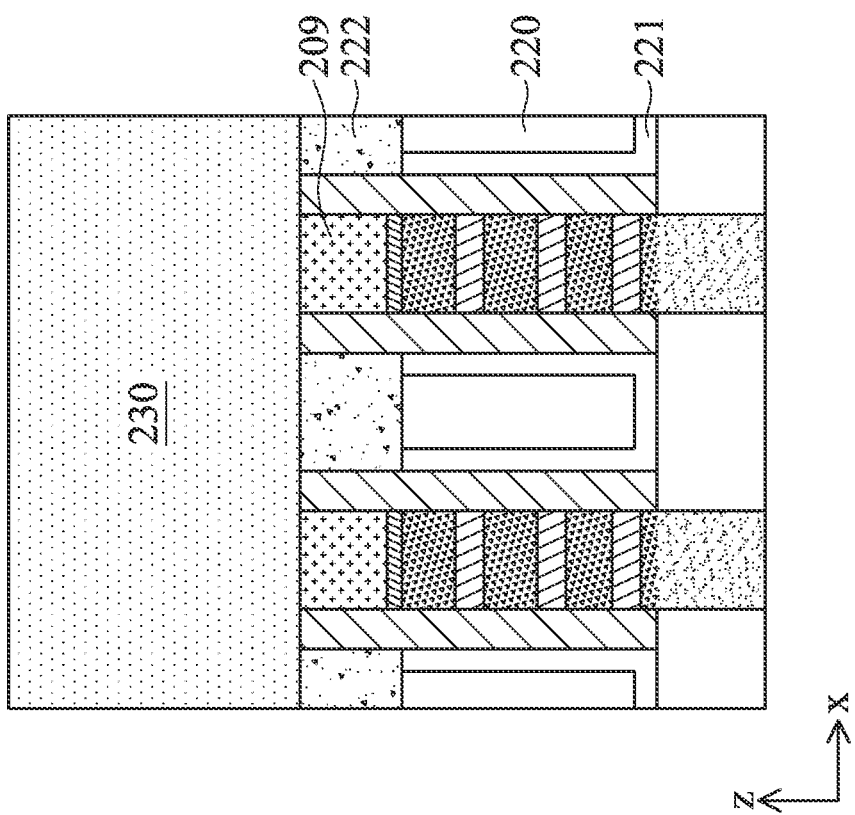
Figure 8C:
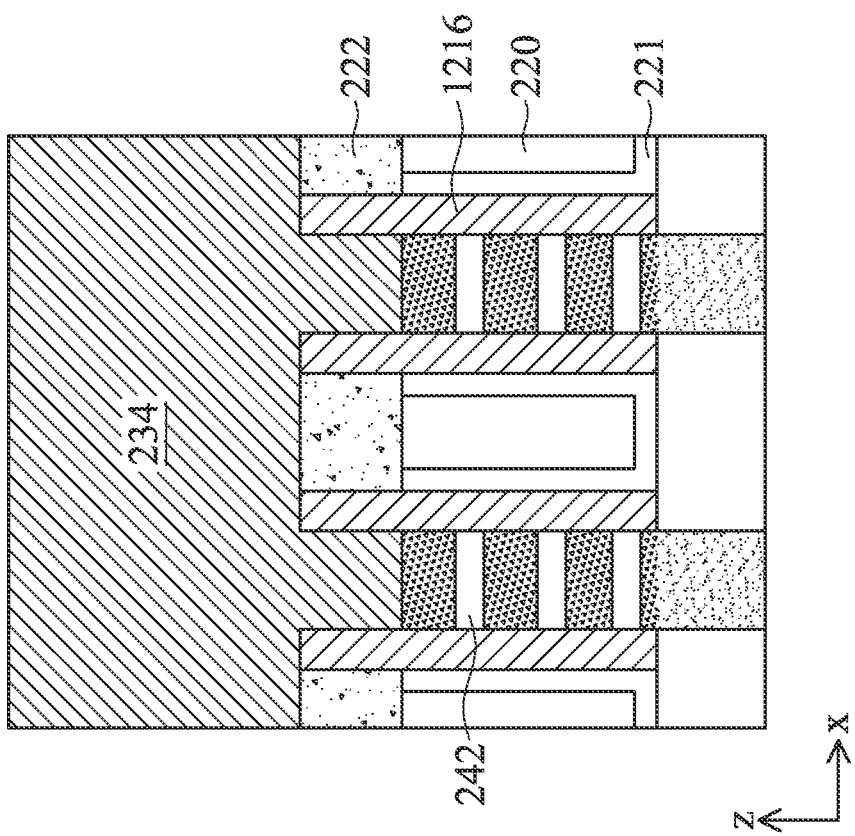
Figure 8F:
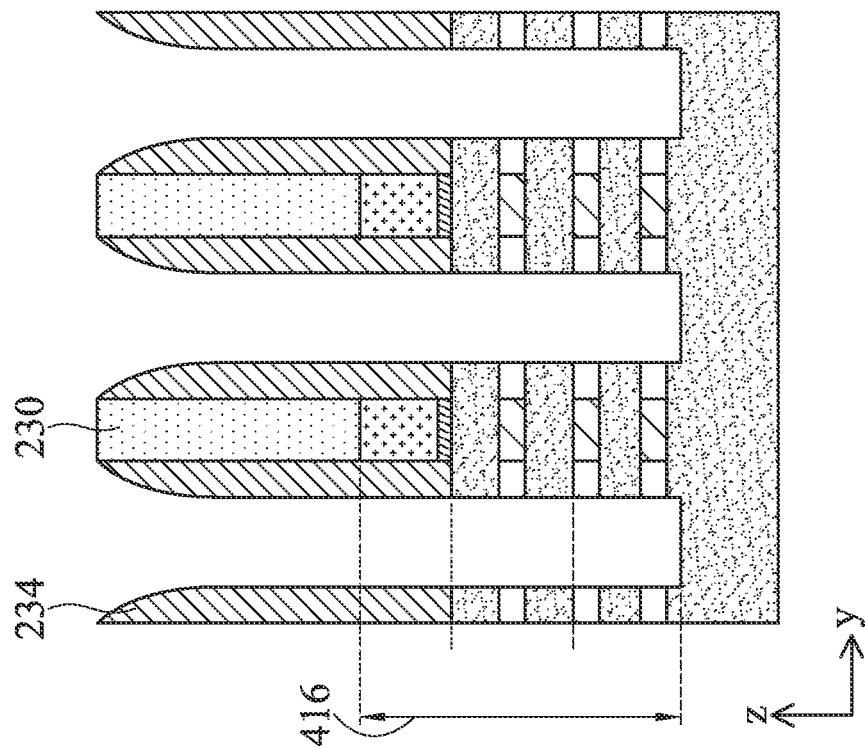
Figure 8E:
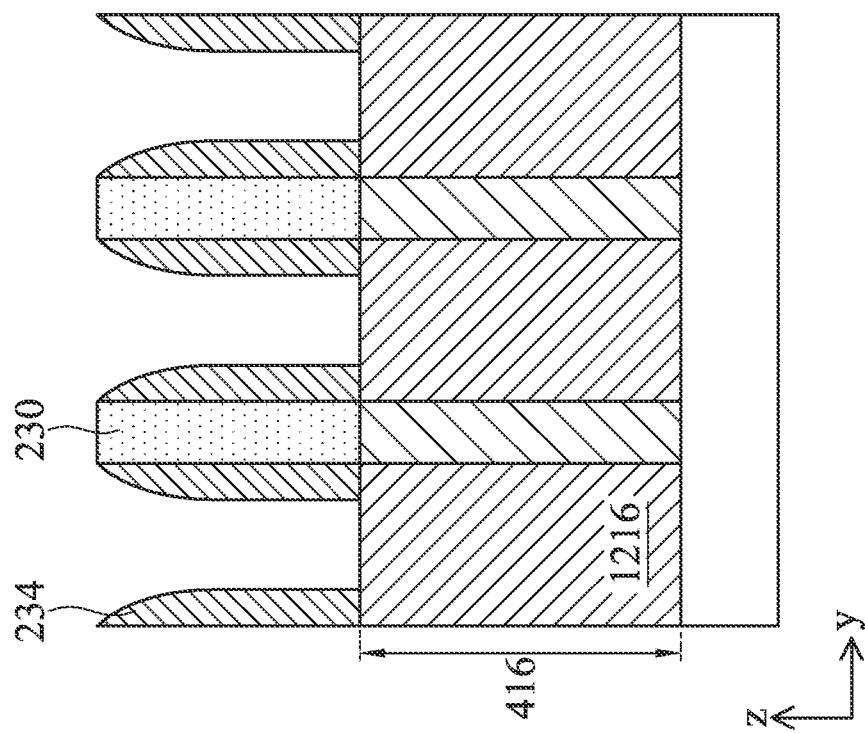
Figure 8G:
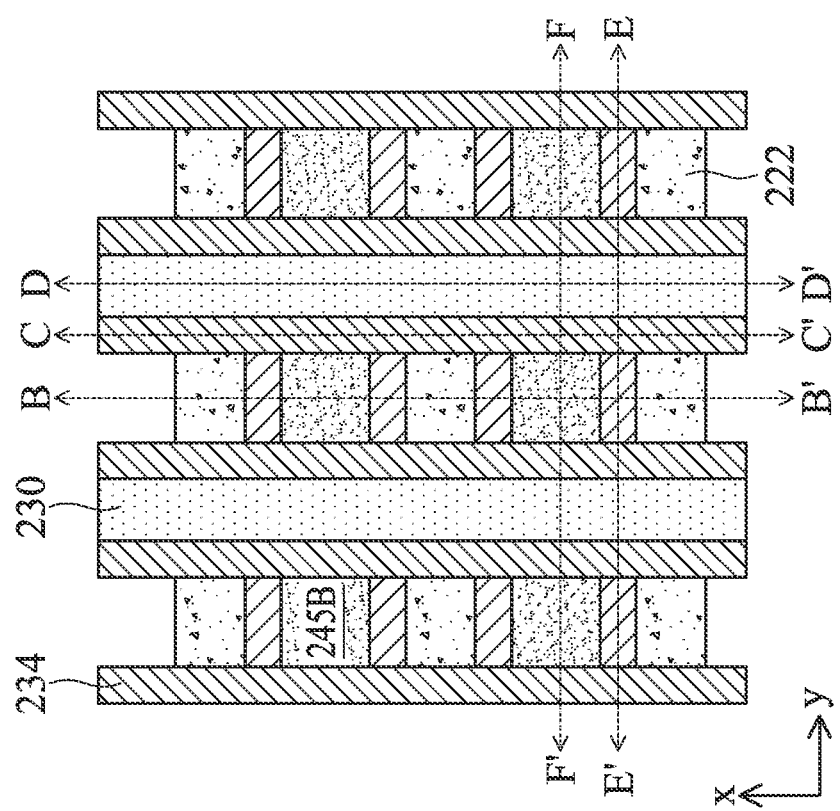

Referring to FIGS. 8A-8D, the method 100 includes a block 116 where inner spacer features 242 are formed. In some embodiments, the sacrificial layers 206 exposed in the source/drain trenches 236 are selectively and partially recessed to form inner spacer recesses, without substantially affecting the exposed channel layers 208. In an embodiment where the channel layers 208 consist essentially of crystalline silicon (Si) and sacrificial layers 206 consist essentially of silicon germanium (SiGe), the selective and partial recess of the sacrificial layers 206 may include a SiGe oxidation process followed by a SiGe-oxide removal. In such embodiments, the SiGe oxidation process may include use of ozone, and the extent at which the sacrificial layers 206 are recessed are determined by a time duration of the oxidation process. In some other embodiments, the selective recess may be a selective isotropic etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include a hydro fluoride (HF) or NH4OH etchant. In some embodiments, the selective recessing of the sacrificial layers 206 is configured such that the portion of the sacrificial layers 206 directly and vertically underneath the gate spacers 234 are removed while the portion of the sacrificial layers 206 under the gate stacks 230 are preserved. Subsequently, as illustrated in FIGS. 8C and 8F, an inner spacer material layer is then deposited using CVD or ALD over the workpiece 200, including over and into the inner spacer recesses. The inner spacer material may include silicon nitride, silicon oxycarbonitride, silicon carbonitride, silicon oxide, silicon oxycarbide, silicon carbide, silico oxynitride, other suitable materials, or combinations thereof. After the deposition of the inner spacer material layer, the inner spacer material layer is etched back to form inner spacer features 242. Accordingly, in the depicted embodiments, the inner spacer features 242 are formed between end portions of the vertically adjacent channel layers 208 and between horizontally adjacent dielectric features 1216 along the X-direction. Moreover, the inner spacer features 242 are formed vertically beneath the gate spacers 234. The inner spacer features 242 isolates the remaining portions of the sacrificial layers 206 from areas where source/drain features are formed, such that subsequent etching operations on the sacrificial layers 206 do not affect the integrity of the source/drain features.

Referring to FIGS. 9A-9G, the method 100 includes a block 118 where the dielectric features 1216 are recessed along the Z-direction. For example, the height of the dielectric features 1216 are reduced from the height 416 (see FIG. 8B) to the height 418 (or interchangeably referred to as the distance 418). In some embodiments, the recessed dielectric features 1216 have a top surface that extends below a top surface of the dielectric features 218. For example, the recessed dielectric features 1216 may have a top surface that extends below a top surface of the filler layers 220. In some embodiments, the width 406 of the dielectric features 1216 are substantially preserved. The recessing of the dielectric features 1216 may implement any suitable etching methods. In some embodiments, dry etching methods are implemented. Moreover, parameters of the etching operation are adjusted to tune the height of the dielectric features 1216 according to the desired height 418 as described below. For example, the time duration of the etching operation is adjusted in order to reach the desired height 418 and the desired ratio of the height 418 relative to the height 416.

In some embodiments, the height 418 may be about 5 nm to about 40 nm. For example, a ratio of the height 418 to the height 416 may be about 0.05:1 to about 0.7:1. In some embodiments, the height 418 may be about 10 nm to about 30 nm. For example, a ratio of the height 418 to the height 416 may be about 0.1:1 to about 0.5:1. As described below, the recessed dielectric features assist the adjustment of the profiles of the subsequently formed source/drain features and contribute to reduced device fringe capacitances. If the height 418 is too small, such as less than about 5 nm, or if the ratio is too small, such as less than about 0.05:1, the beneficial effect in capacitance reduction may be limited; if the height 418 is too large, such as greater than about 40 nm, or if the ratio is too large, such as greater than about 0.7:1, the landing platform for the subsequently formed contact features on the source/drain features may be reduced and lead to increases in the contact resistances. Meanwhile, because the top portions of the dielectric features 1216 are removed, sidewall surfaces of the dielectric features 218 are exposed in the source/drain trenches 236. As described above, sidewall surfaces of adjacent dielectric features 218 are spaced away by the distance 410. The distance 410 determines the width of the top portions of source/drain features subsequently formed in the source/drain trenches 236 and is therefore interchangeably referred to as the width 410. Accordingly, the source/drain trenches 236 each have a lower portion 236A having a width 408 across the X-direction and a top portion 236B having a width 410 across the X-direction. In some embodiments, a ratio of the width 410 to the width 408 is about 1.5:1 to about 2:1. If the ratio is too small, such as less than about 1.5:1, any reduction in capacitances from forming the dielectric features 1216 may be limited. Conversely, if the ratio is too large, such as greater than about 2:1, the additional benefit achieved may not sufficiently offset the extra processing costs. A distance between the top surface of the recessed dielectric feature 1216 to the top surface of the dielectric layer 222 is referred to as the distance 420. The distance 420 is slightly less than the distance 416 (for example about 1% to about 20% less).

Figures 9A, 9B:
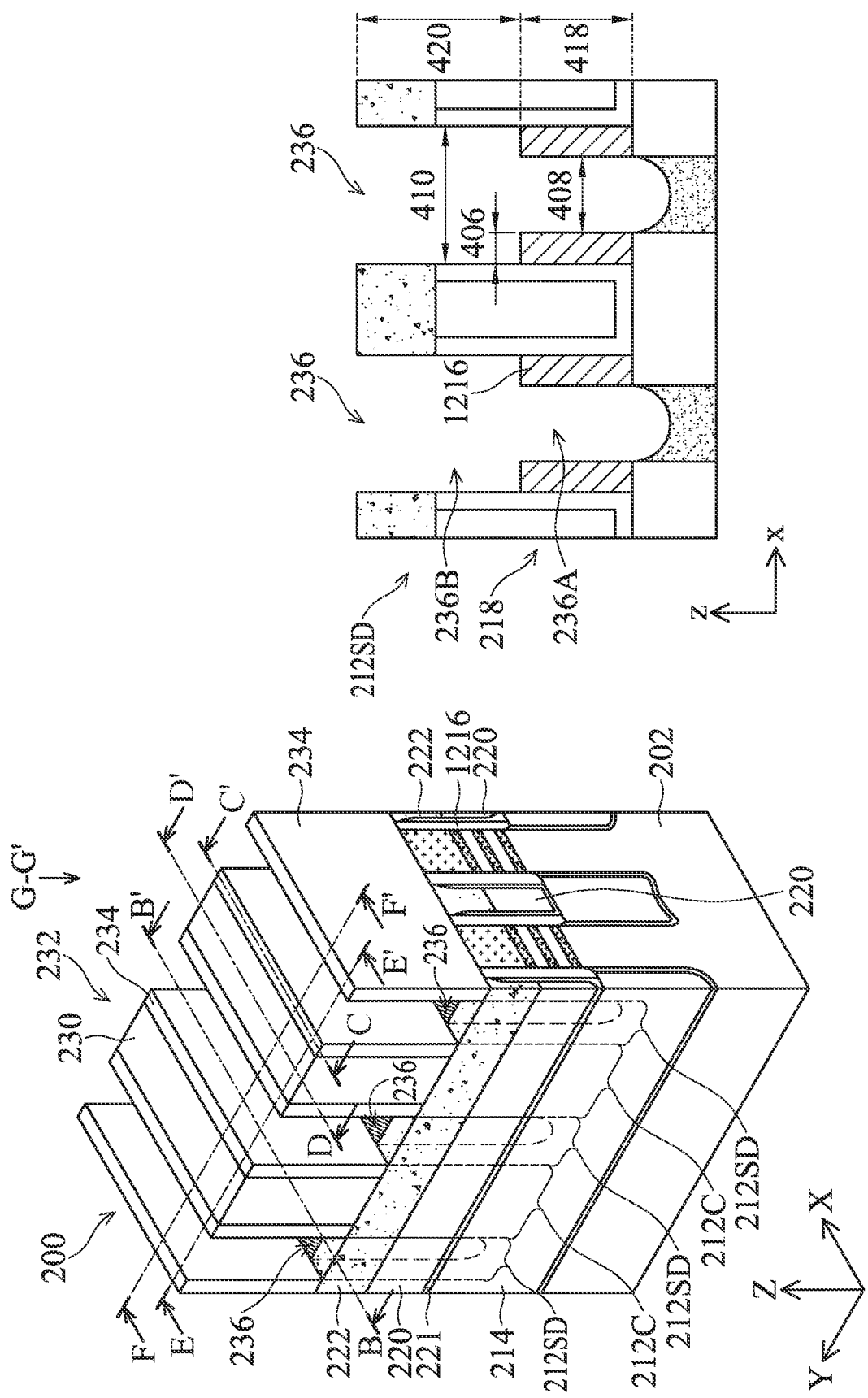
Figure 9B:
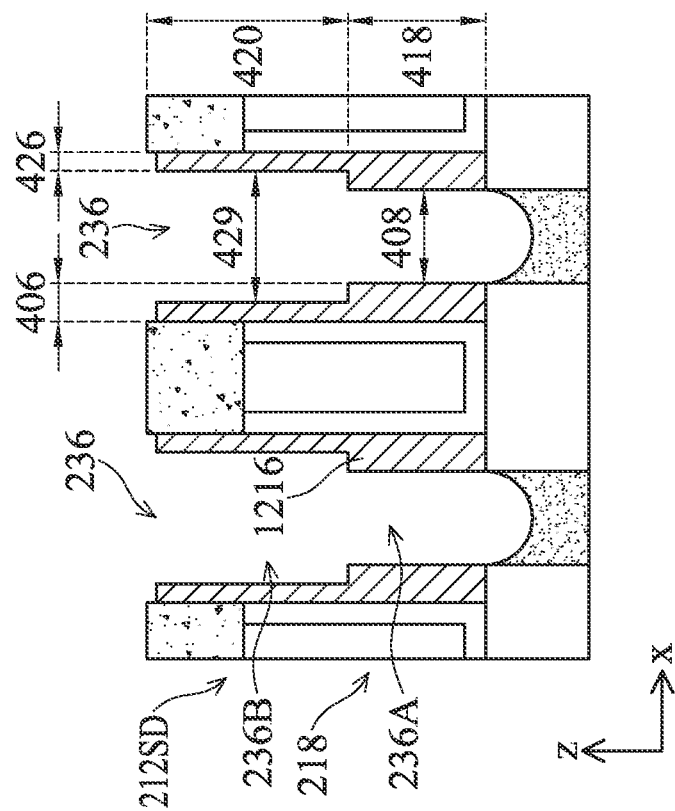
Figure 9B:
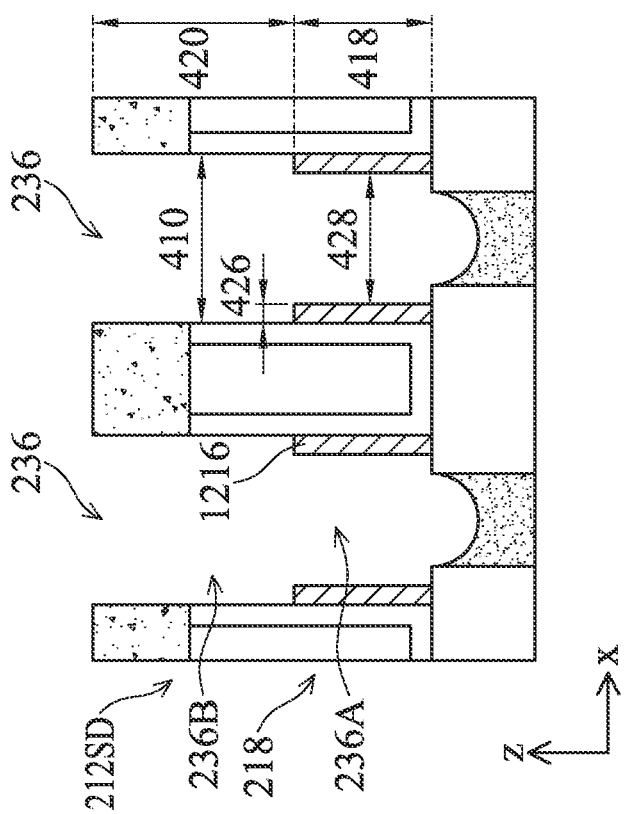
Figure 9D:
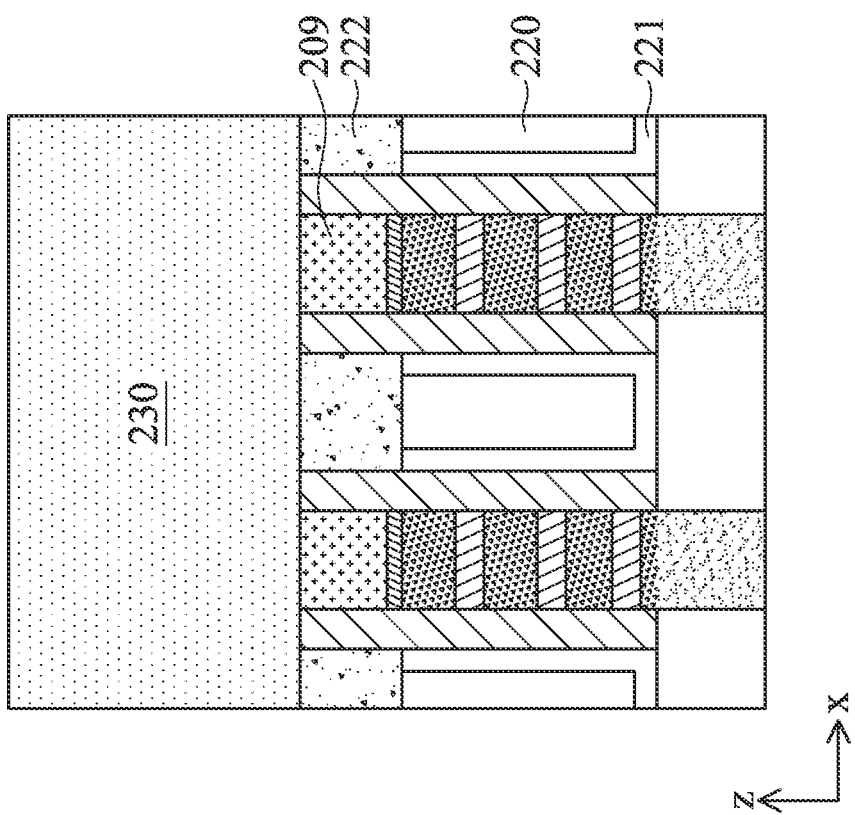
Figure 9C:
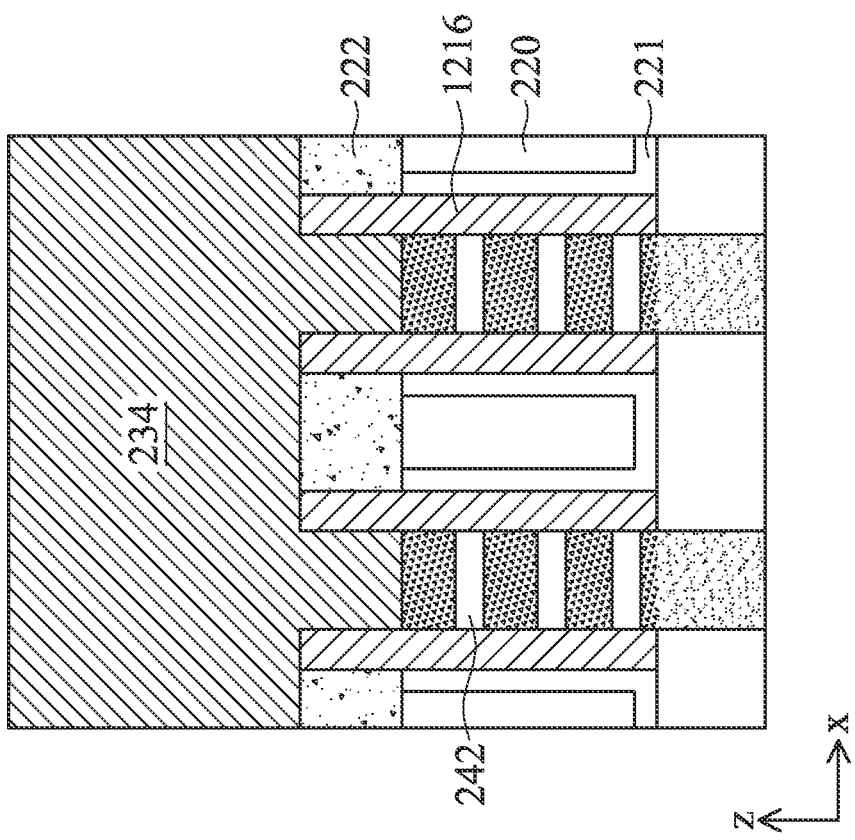
Figure 9F:
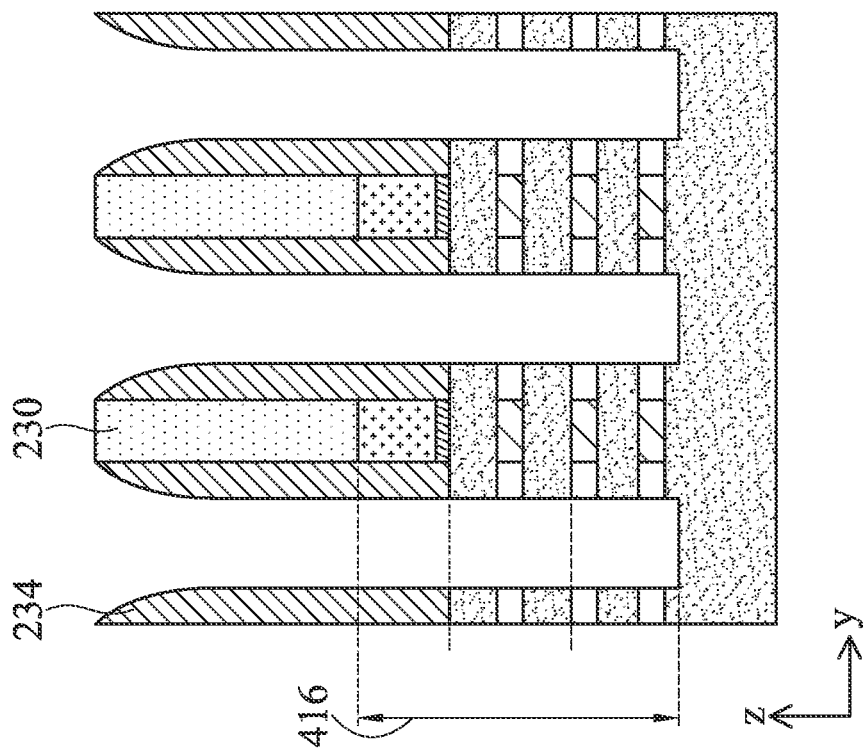
Figure 9E:
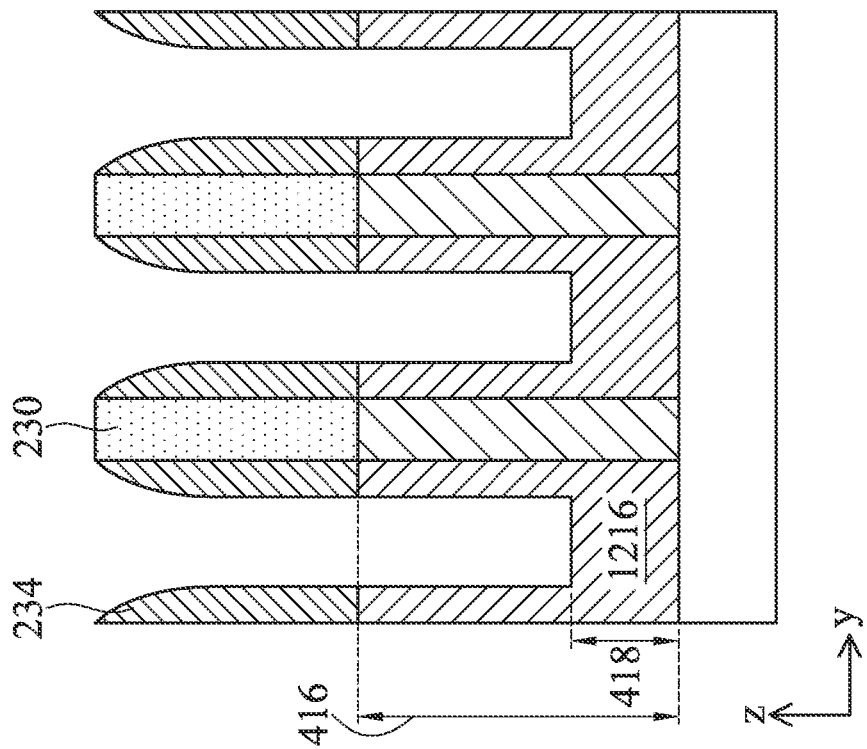
Figure 9G:
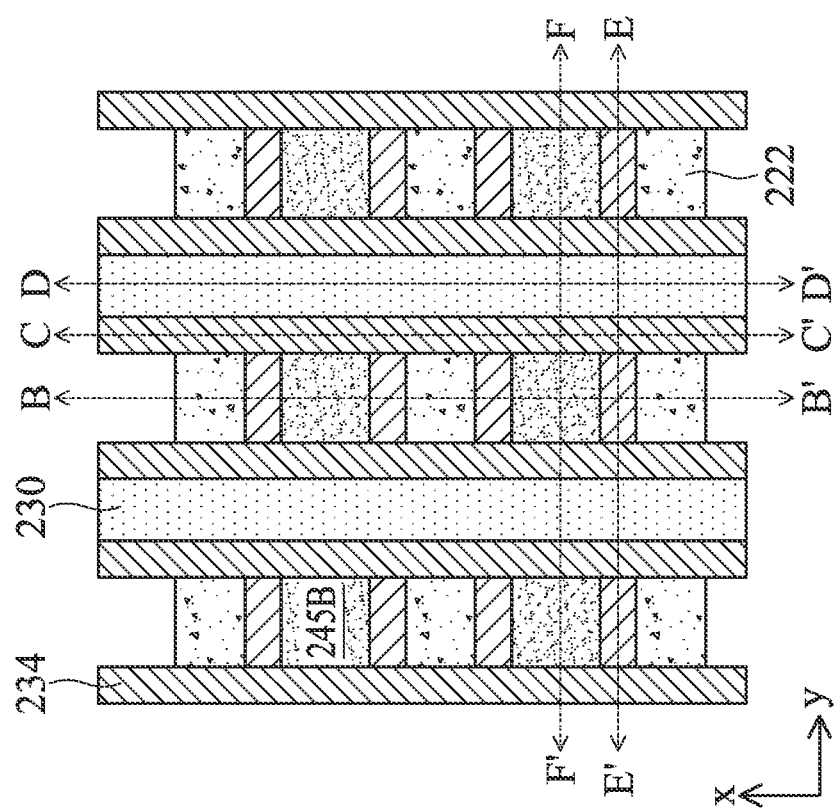
Figures 10A, 10B:
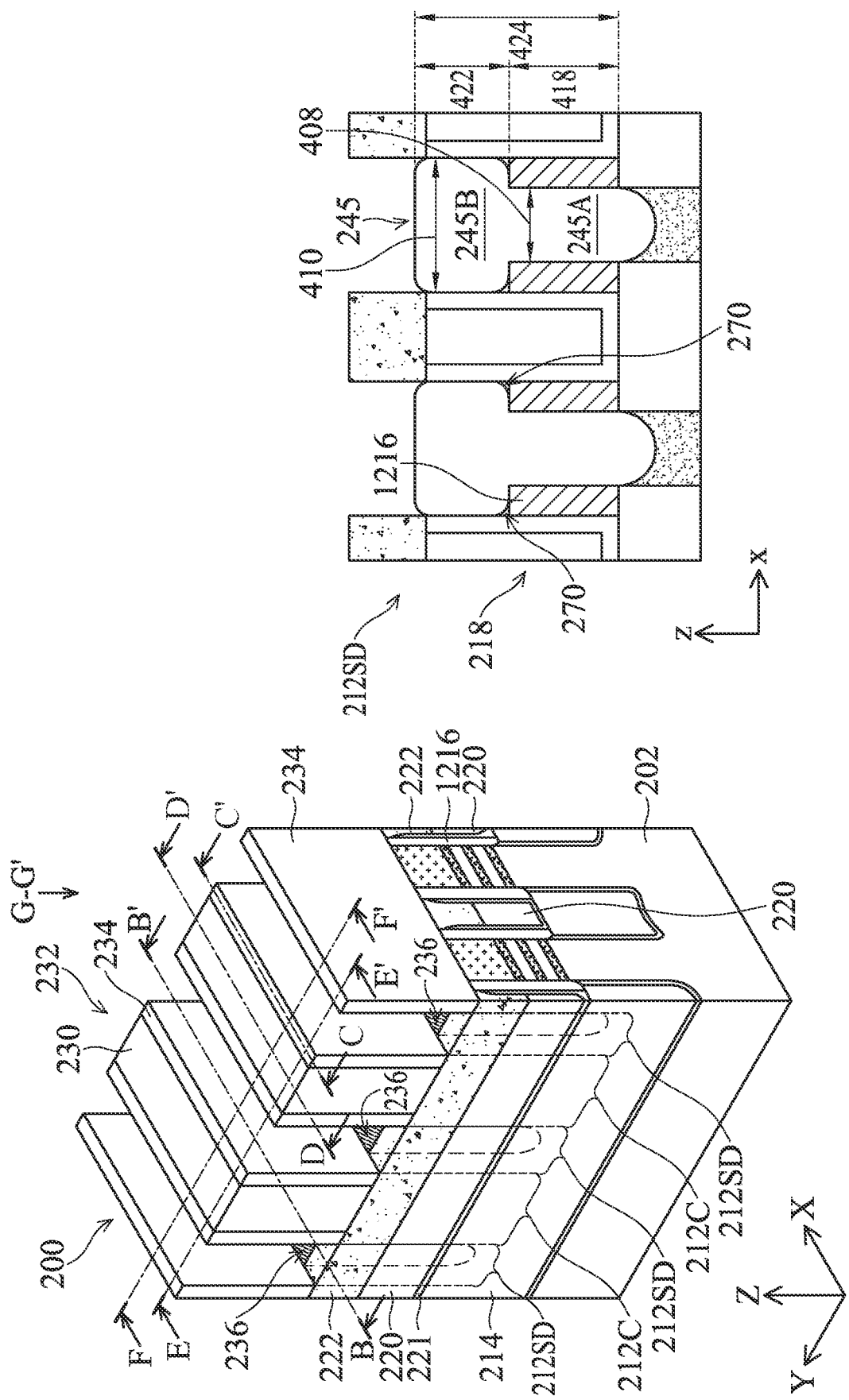
Figure 10D:
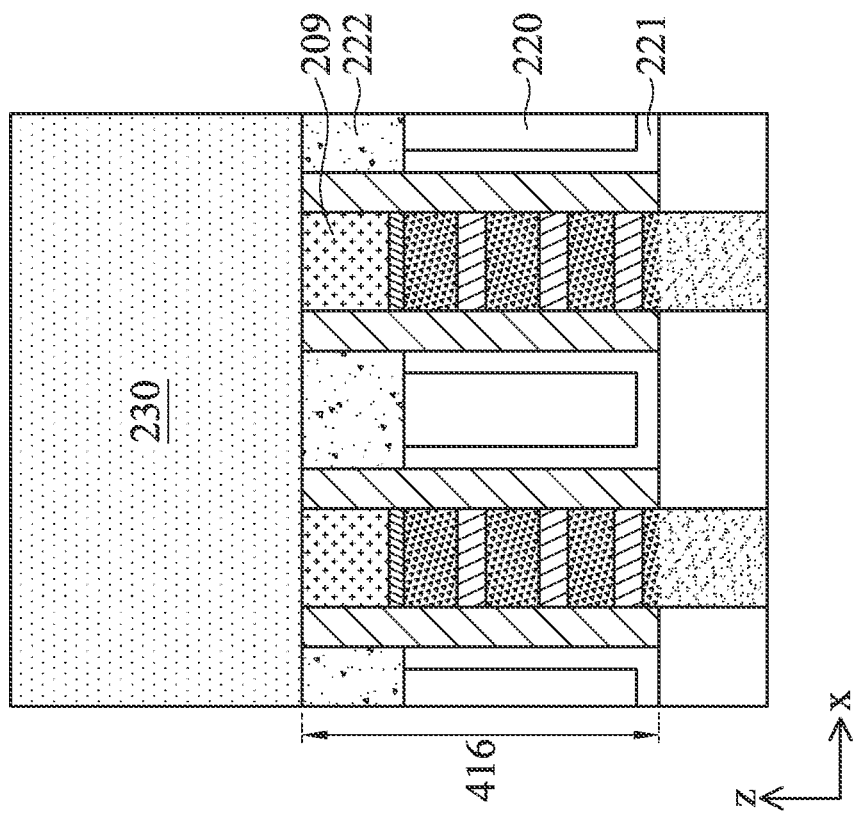
Figure 10C:
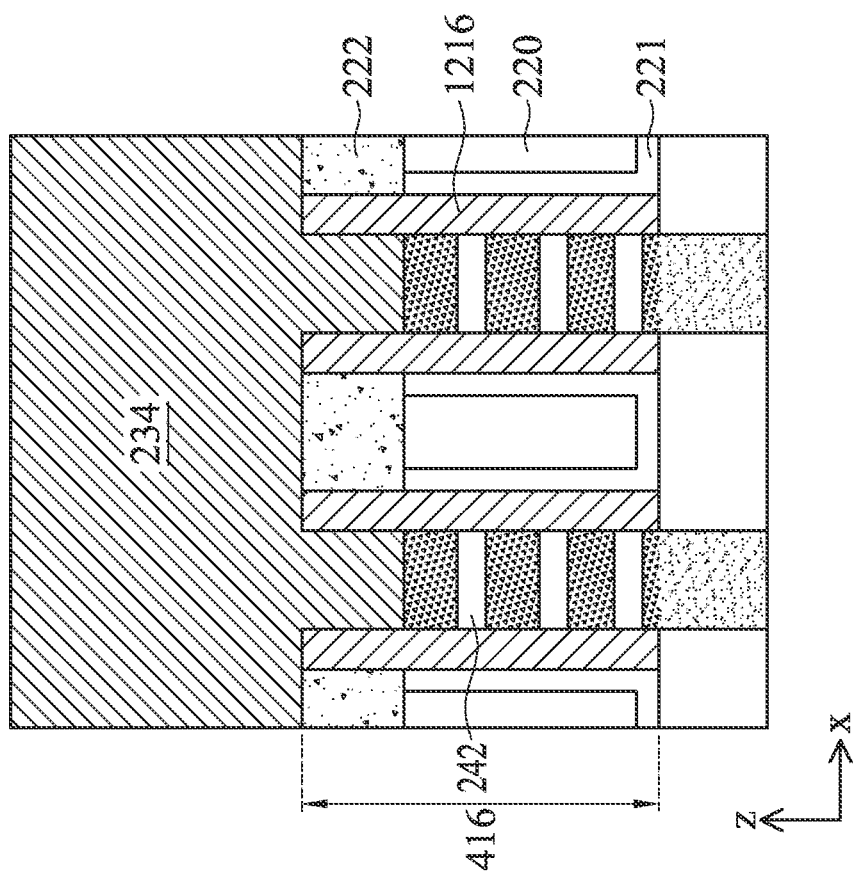
Figure 10F:
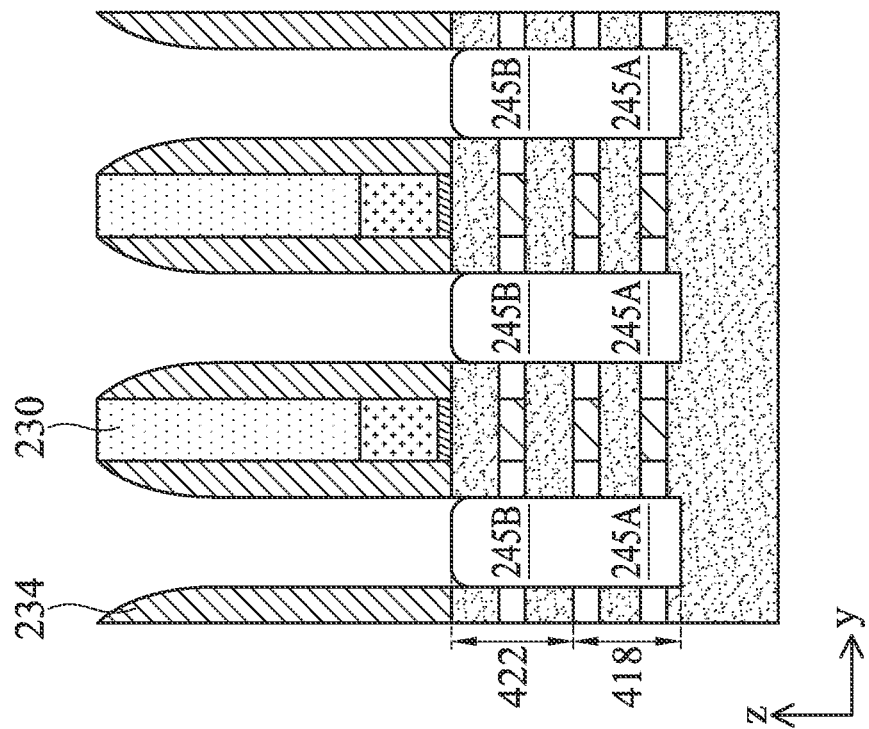
Figure 10E:
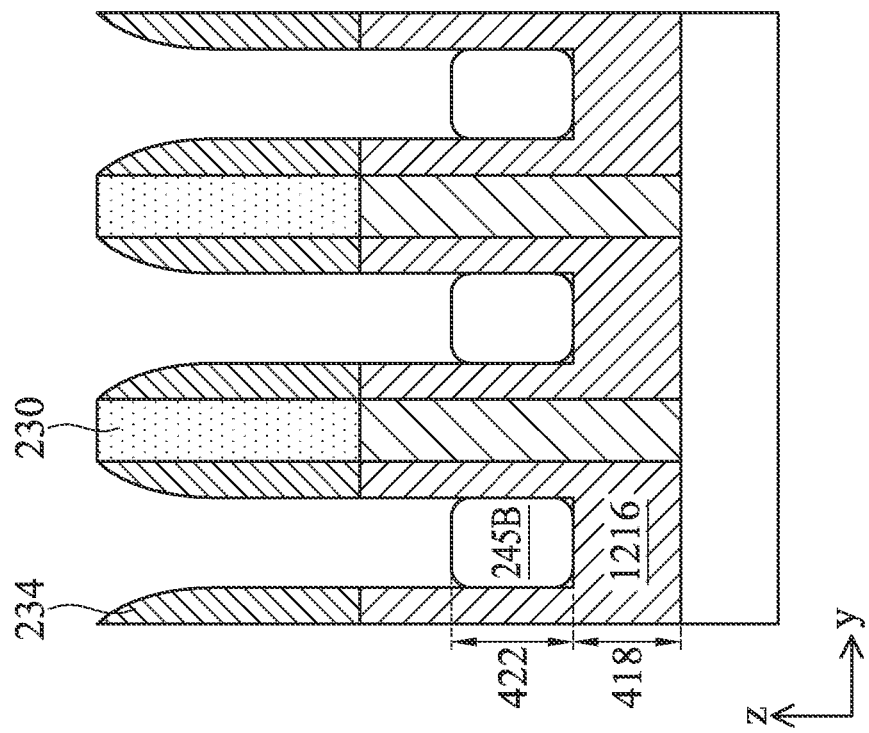
Figure 10G:
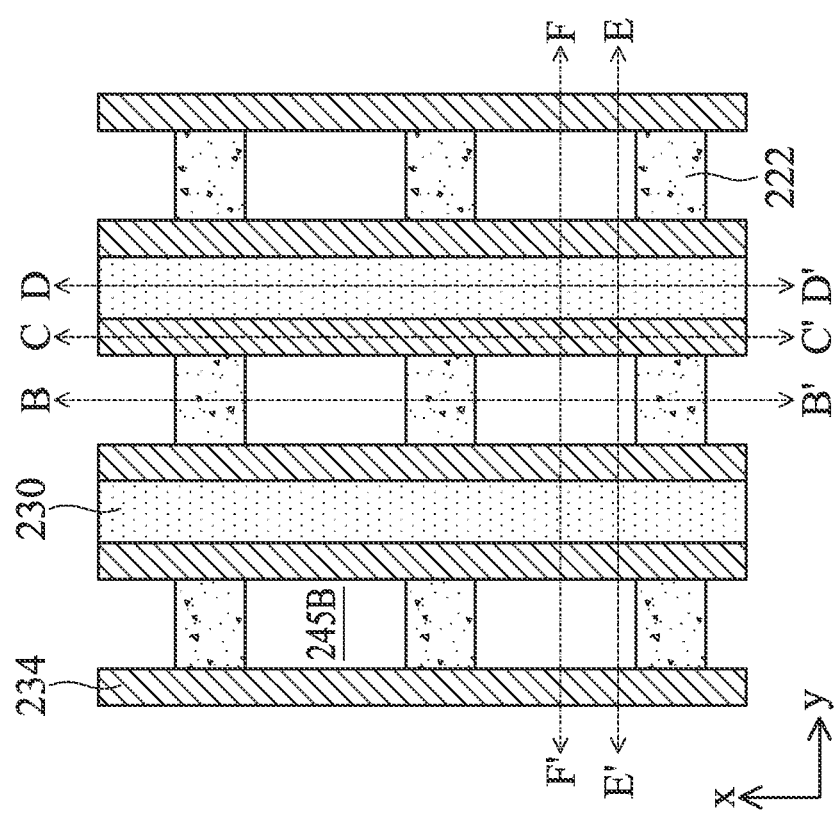

Alternatively, referring to FIG. 9B', in some embodiments, the dielectric features 1216 are not only vertically recessed, but also laterally recessed, such that the width of the remaining portions of the dielectric features 1216 is reduced from the width 406 (see FIG. 8B) to the width 426. In such embodiments, the width of the lower portions 236A of the source/drain trenches 236 is increased to the width 428, while the width of the higher portions 236B of the source/drain trenches 236 stays as width 410. In some embodiments, the lateral recessing operation adjusts the lateral widths of the subsequently formed source/drain features to achieve a designed size along the X-direction. For example, this allows fine-tuning of profiles of the source/drain features subsequently formed. As described below, in some embodiments, having a greater width 428 assists ensuring that the entire sidewall surfaces of the channel layers 208 are covered by the source/drain features, such that the full capacity of the channel layers 208 are utilized. In some embodiments, a ratio of the width 410 to the width 428 is about 1.7:1 to about 4:1.

Accordingly, the present disclosure provides source/drain trenches 236 having a stepped sidewall profile on the X-Z cross-section (e.g. perpendicular to the direction along which the fin-shaped structures 212 extend), such that the source/drain trenches 236 have a wider opening at the top than at the bottom. This configuration allows for minimizing contact resistance between subsequently formed source/drain features and the overlaying contact features, as well as for minimizing the capacitances at the bottom portions of the source/drain features. The present disclosure contemplates other methods for forming similar stepped profiles for the source/drain trenches 236 (and for the subsequently formed source/drain features). For example, FIG. 9B" illustrates another embodiment, where the top portions of the dielectric features 1216 are not removed, but rather laterally recessed to a reduced width (such as width 429). Meanwhile, the lower portions of the dielectric features 1216 are not recessed, such that they retain the width 408. In some embodiments, a ratio of the width 429 to the width 408 is about 1.2:1 to about 1.7:1. In still other embodiments, both top and bottom portions of the dielectric features 1216 may be laterally recessed, although to different extents, so as to form the stepped profile with similar dimension ratios. The disclosures below proceed from the embodiment of FIG. 9B, although similar operations may proceed from other similar embodiments.

Referring to FIGS. 10A-10G, the method 100 includes a block 120 where source/drain features 245 are formed in the source/drain trenches 236 and substantially fill majority of the source/drain trenches 236. In some embodiments, the source/drain features 245 are selectively and epitaxially formed on the exposed sidewall surfaces of the channel layers 208 and on the exposed top surfaces of the substrate 202 in the source/drain trenches 236. Moreover, the growth (or "overgrowth") of the source/drain features 245 from individual channel layers 208 and from the substrate 202 eventually merge over remaining portions of the sidewall surfaces of the source/drain trenches 236, such as over sidewall surfaces of the dielectric features 1216 and over sidewall surfaces of the dielectric features 218. As described above, the source/drain trenches 236 includes lower portions 236A having a smaller width (width 408) along the X-direction and top portions 236B having a greater width (width 410) along the X-direction. Accordingly, the source/drain features 245 each include a lower portion 245A extending between the two recessed dielectric features 1216, and a top portion 245B over the lower portion 245A, as well as over top surfaces of the recessed dielectric features 1216. Moreover, the top portion 245B extend between and directly contacts sidewall surfaces of the dielectric features 218. In the depicted embodiments, the lower portions 245A have the height 418 and the width 428 (see FIG. 10B). In the depicted embodiments, the source/drain trench portions 236A and 236B each have substantially straight sidewalls. Accordingly, the widths of the lower portions 245A of the source/drain features 245 and the widths of the top portions 245B of the source/drain features 245 are each substantially uniform. The width of the lower portions 245A along the X-direction may be substantially similar to (or matching) the length of the channel layers 208 along the X-direction. Accordingly, the entire conductive capacitance of the channel layers 208 is fully utilized without forming an excessively large lower portion 245A that tends to result in higher capacitances. Meanwhile, the width 410 of the top portions 245B is greater than that of the lower portions 245A, such that the top surface of the top portions 245B have greater surface areas for better contact with the subsequently formed contact features. In the depicted embodiments, the difference between the width 410 and the width 408 is twice the thickness (or width 406) of the dielectric features 1216.

Moreover, in the depicted embodiments, the top portions 245B has a height 422. In other words, a top portion of the source/drain features 245 (or the top portions 245B) extends above the top surfaces of the dielectric features 1216 by the distance 422. In some embodiments, the distance 422 may be about 5 nm to about 40 nm. The distance 422 (or the height 422) is less than the distance 420. Accordingly, the source/drain features 245 have a height 424 that equals the sum of the distance 418 and the distance 422. In some embodiments, a ratio of the distance 418 to the distance 422 is about 0.1:1 to about 10:1, such as about 0.5:1 to about 2:1. In other words, a ratio of the height 424 to the height 418 is about 1.1:0.1 to about 11:10, such as about 1.5:0.5 to about 3:2. If the ratio is too small, the beneficial effect in capacitance reduction may be limited; if the ratio is too larger, the landing platform for the subsequently formed contact features on the source/drain features may be reduced and lead to resistance increases. In some embodiments, the top portions 245B entirely cover and directly contact the top surface of the dielectric features 1216. In some embodiments, the growth of the source/drain features 245 is configured to leave air gaps 270 between the top surfaces of the dielectric features 1216 and the top portions 245B of the source/drain features 245. In some embodiments, the air gaps 270 help reducing the capacitances of the device.

The source/drain features 245 may be formed using an epitaxial process, such as vapor-phase epitaxy (VPE), ultra-high vacuum CVD (UHV-CVD), molecular beam epitaxy (MBE), and/or other suitable processes. The source/drain features 245 may be either n-type or p-type. When the source/drain features 245 are n-type, they may include silicon (Si) and may be doped with an n-type dopant, such as phosphorus (P) or arsenic (As). When the source/drain features 245 are p-type, they may include silicon germanium (SiGe) or germanium (Ge) and may be doped with a p-type dopant, such as boron (B) or gallium (Ga). In some embodiments, the source/drain features 245 may each have multiple layers.

Figure 11:
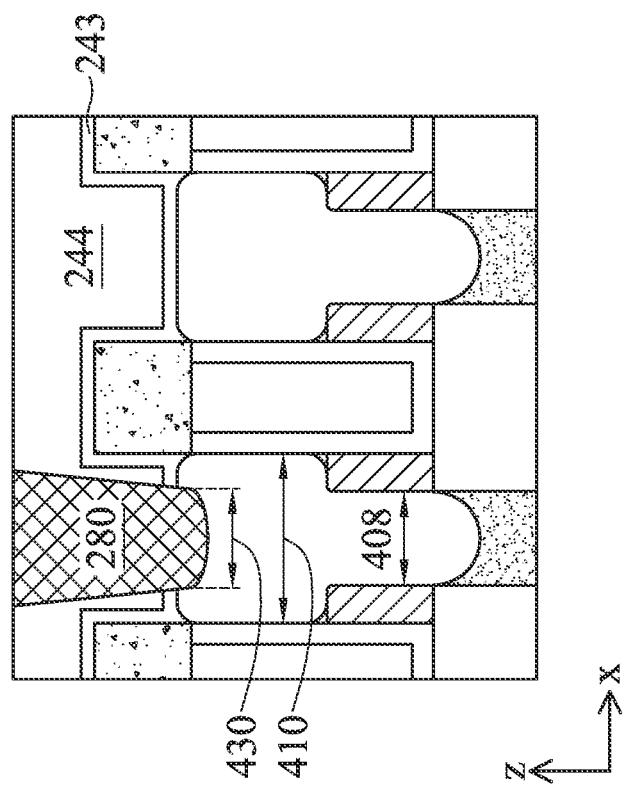

Referring to FIG. 11, the method 100 includes a block 122 where a contact etch stop layer (CESL) 243 and an interlayer dielectric (ILD) layer 244 are formed over the workpiece 200. In an example process, the CESL 243 is first conformally deposited over the workpiece 200 and then the ILD layer 244 is blanketly deposited over the CESL 243. The CESL 243 may include silicon nitride, silicon oxide, silicon oxynitride, and/or other materials known in the art. The CESL 243 may be deposited using ALD, plasma-enhanced chemical vapor deposition (PECVD) process and/or other suitable deposition or oxidation processes. In some embodiments, the ILD layer 244 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be deposited by spin-on coating, an FCVD process, or other suitable deposition technique. In some embodiments, after formation of the ILD layer 244, the workpiece 200 may be annealed to improve integrity of the ILD layer 244. To remove excess materials and to expose top surfaces of the gate electrode, a planarization process (such a chemical mechanical polishing (CMP) process) may be performed to the workpiece 200.

In some embodiments, the method 100 proceeds to a gate replacement process where the gate stacks 230 are replaced with functional gate structures (see block 124 of FIG. 12). Gate replacement processes have been described in, for example, U.S. patent application Ser. No. 16/657,606 filed on Oct. 18, 2019 to Jhon Jhy Liaw, the entirety of which is incorporated herein by reference. For example, the method at block 122 includes removing the gate stacks 230 to form a gate trench. Remaining portions of the sacrificial layers 206 between the channel layers 208 in the channel regions 212C are selectively removed from the exposed sidewalls in the gate trenches. Moreover, the remaining portions of the cladding layer 216 under the gate stacks 230 are also removed. This process releases the channel layers 208 to form channel members. The channel members are vertically stacked along the Z direction. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as $NH_4OH$. An interfacial layer and a gate dielectric layer are deposited in the gate trenches to wrap around each of the channel members. In some embodiments, the interfacial layer includes silicon oxide and may be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel members to form interfacial layer. The gate dielectric layer is then deposited over the interfacial layer using ALD, CVD, and/or other suitable methods. The gate dielectric layer may be formed of high-K dielectric materials. A gate electrode layer is deposited in the gate trenches. The gate electrode layer may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process. Accordingly, functional gate structures are formed to wrap around channel members in channel regions 212C, and include interfacial layers, gate dielectric layers, and gate electrode layers.

In some embodiments, a planarization process, such as a CMP process, may be performed to remove excessive materials to provide a substantially planar top surface of the gate structures; gate capping layers, gate self-aligned-contact (SAC) dielectric layers, silicide layers, and/or source/drain contacts may be formed on the workpiece 200. Referring to block 126 of FIG. 12 and to FIG. 11, contact features 280 are formed in the ILD layer 244. In some embodiments, an etching process is employed to remove portions of the ILD layer 244 to form contact trenches. In some embodiments, the etching operation also removes portions of the CESL 243 such that the source/drain features 245 are exposed in the contact trenches. In the depicted embodiments, the contact features 280 may have a bottom surface that has a width 430 along the X-direction. In some embodiments, the width 430 is less than the width 410. In such embodiments, the full dimension of the contact features 280 along the X-direction is utilized such that the contact resistance is minimized. In some embodiments, the width 430 is about 15 nm to about 30 nm. In some embodiments, a ratio of the width 430 to the width 410 is about 1.5:1 to about 3:1. Moreover, in some embodiments, the width 430 is greater than the width 408. In some approaches, the width 430 is less than width 408. In such approaches, the size of the contact features 280 may not have been maximized and the contact resistances between the contact features 280 and the source/drain features 245 may not have been minimized. In some embodiments, a ratio of the width 430 to the width 408 is about 0.5:1 to about 1.2:1.

The methods described above result in several features in the devices fabricated. For example, the device includes source/drain features 245 that have stepped sidewall profiles across the lengthwise direction of the gate stacks. A top portion 245B of the source/drain features 245 may have a width 410 along the X-direction that is greater than the width 408 of the lower portion 245A of the source/drain features 245. The top portion 245B of the source/drain features 245 are partially disposed on top surfaces of the dielectric features 1216. Moreover, the top portions 245B of the source/drain features 245 extend between (and directly contact) opposing sidewall surfaces of the dielectric features 218. However, the lower portions 245A of the source/drain features 245 extend between opposing sidewall surfaces of the dielectric features 1216 and are spaced away from the dielectric features 218. Moreover, the lower portions 245A and the top portions 245B each interface with dielectric features of different materials. The device also includes contact features 280 having a width 430 along the X-direction. In some embodiments, the width 430 may be greater than the width 408 and less than the width 410. In some embodiments, a ratio of the width 410 to the width 408 of the channel layers may be about 1.5:1 to about 2:1. The source/drain features 245 are connected by the stack of channel layers 208. In some embodiments, the topmost channel layer 208 is connected to the top portion 245B. In some embodiments, the bottommost channel layer is connected to the lower portion 245A of the source/drain features 245. In other words, the source/drain features 245 have a different lateral width at the height level of a top surface of the topmost channel layer 208 as compared to at the height level of a bottom surface of the bottommost channel layer 208. These device features allow the device performances to be optimized. For example, the source/drain features have a larger landing platform for interfacing with the contact features for resistance reductions, and have a smaller bottom dimension for reduced fringe capacitances. By contrast, in approaches not implementing features of the present disclosure, for example, where the source/drain features have substantially straight profiles and uniform lateral dimensions across their respective heights, it may be challenging to simultaneously optimize the contact resistance as well as the fringe capacitance.

In one exemplary aspect, the present disclosure is directed to a device. The device includes a semiconductor substrate. The semiconductor substrate has a substrate surface. The device also includes a stack of channel layers on the semiconductor substrate. A top surface of a topmost channel layer of the stack of channel layers extends along a first height relative to the substrate surface. A bottom surface of a bottommost channel layer of the stack of channel layers extends along a second height relative to the substrate surface. The device further includes a gate structure that engages with the stack of channel layers and extending along a first direction. Additionally, the device includes a source/drain feature on first sidewall surfaces of the stack of channel layers and on the substrate, where the first sidewall surfaces extends in parallel to the first direction. Moreover, the source/drain feature has a first width along the first direction at the first height and a second width along the first direction at the second height, and wherein the first width is greater than the second width.

In some embodiments, the device also includes a first dielectric feature on second sidewall surfaces of the stack of channel layers. The second sidewall surfaces extend perpendicular to the first direction. Moreover, the first dielectric feature has a third width along the first direction. Furthermore, the third width substantially equals to half of a difference between the first width and the second width. In some embodiments, the first dielectric feature has a top surface extending along a third height above the substrate surface. The third height is greater than the second height and less than the first height. In some embodiments, the first dielectric feature includes one of silicon carbonitride (SiCN), silicon carboxynitride (SiCON), and silicon carbide (SiC). In some embodiments, the source/drain feature has a first portion over a second portion and the second portion directly contacts the substrate. The first portion has the first width and the second portion has the second width. Moreover, the first portion has a third height relative to the substrate surface, and the second portion has a fourth height relative to the substrate surface. A ratio of the third height to the fourth height is about 1.5:0.5 to about 3:2. In some embodiments, the device further includes a second dielectric feature that extends along a second direction perpendicular to the first direction. A top portion of the source/drain feature directly contacts the second dielectric feature, and a bottom portion of the source/drain feature is spaced away from the second dielectric feature. In some embodiments, a ratio of the first width to the second width is about 1.5:1 to about 2:1. In some embodiments, the stack of channel layers each have a fourth width along the first direction, and wherein the fourth width is about the same as the second width. In some embodiments, the source/drain feature has a sidewall having a stepped profile, the stepped profile defined by a first feature of a first dielectric material and a second feature of a second dielectric materials different from the first dielectric material.

In one exemplary aspect, the present disclosure is directed to a device. The device includes a semiconductor substrate, a first dielectric feature, a second dielectric feature, a third dielectric feature, and a fourth dielectric feature on the semiconductor substrate. The first dielectric feature has a first sidewall surface, and the second dielectric feature has a second sidewall surface, where the first sidewall surface faces the second sidewall surface. Moreover, the third dielectric feature is on the first sidewall surface and has a third sidewall surface; the fourth dielectric feature is on the second sidewall surface and has a fourth sidewall surface, where the third sidewall surface facing the fourth sidewall surface. The device also includes a source/drain feature over the semiconductor substrate. The source/drain feature has a bottom portion that extends between the third sidewall surface and the fourth sidewall surface. Furthermore, the source/drain feature has a top portion that extends between the first sidewall surface and the second sidewall surface. A first distance between the third sidewall surface and the fourth sidewall surface is less than a second distance between the first sidewall surface and the second sidewall surface. Additionally, the first dielectric feature and the second dielectric feature each include a first dielectric material. The third dielectric feature and the fourth dielectric feature each include a second dielectric material. And the second dielectric material is different from the first dielectric material.

In some embodiments, the top portion of the source/drain feature directly contacts a top surface of the third dielectric feature and directly contacts a top surface of the fourth dielectric feature. In some embodiments, a ratio of the first distance to the second distance is about 1:1.5 to about 1:2. In some embodiments, the third and the fourth dielectric features each have a first height. The top portion of the source/drain feature has a second height, and wherein a ratio of the first height to the second height is about 1:0.5 to about 1:2.

In one exemplary aspect, the present disclosure is directed to a method. The method includes receiving a semiconductor workpiece. The workpiece has active regions extending above a top surface of a semiconductor substrate. The method also includes forming dielectric features on first opposing sidewalls of the active regions across a first direction, etching portions of the active region to form source/drain trenches. The source/drain trenches exposes second opposing sidewalls of the active region. The method further includes recessing the dielectric features and forming source/drain features in the source/drain trenches and on the exposed second opposing sidewalls of the active region. The source/drain features is partially formed on top surfaces of the dielectric features.

In some embodiments, the recessing of the dielectric features includes recessing to reduce a height of the dielectric features relative to the top surface of the semiconductor substrate. In some embodiments, the recessing of the dielectric features includes recessing to form a stepped profile of the source/drain trenches. In some embodiments, the forming of the dielectric feature includes forming a cladding layer on the first opposing sidewalls of the active regions, where the cladding layer has exposed sidewall surfaces. The forming of the dielectric feature also includes forming dielectric barriers on the exposed sidewall surfaces of the cladding layer, removing a portion of the cladding layer between the dielectric barriers and the active regions thereby forming gaps therebetween, and depositing a dielectric material into the gaps. In some embodiments, each of the active region includes a stack of first semiconductor layers and second semiconductor layers over the semiconductor substrate. The first semiconductor layers and the second semiconductor layers have different material compositions and alternate with one another within each of the stacks. Moreover, the method further includes, before the recessing of the dielectric features, replacing a first portion of the second semiconductor layers to form dielectric spacers between end portions of vertically adjacent first semiconductor layers. Furthermore, the method includes, after the forming of the source/drain features, removing a remaining portion of the second semiconductor layers to form gaps. Additionally, the method includes forming metal gate stacks in the gaps. In some embodiments, the first semiconductor layers include crystalline silicon, the second semiconductor layer includes silicon germanium that has germanium at a first atomic percentage, and the cladding layer includes silicon germanium that has germanium at a second atomic percentage. The first atomic percentage is different from the second atomic percentage. In some embodiments, the recessing of the dielectric features exposes top portions of sidewalls of the dielectric barriers. Moreover, the forming of the source/drain features includes forming on the exposed top portions of the sidewalls of the dielectric barriers.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a semiconductor workpiece including active regions extending over a semiconductor substrate;
   forming cladding layers on opposing sidewalls of the active regions;
   forming first dielectric features extending between opposing sidewalls of the cladding layers;
   replacing a portion of the cladding layers with second dielectric features;
   etching portions of the active region to form source/drain trenches;
   recessing the second dielectric features; and
   forming source/drain features in the source/drain trenches, the source/drain features having a stepped profile from a cross-sectional view.

2. The method of claim 1, further comprising forming a gate stack over the active regions,
   wherein after the replacing of the portion of the cladding layers with the second dielectric features, a portion of the cladding layers directly under the gate stack remains.

3. The method of claim 2, further comprising forming gate spacers over sidewalls of the gate stack,
   wherein after the recessing of the second dielectric features, a portion of the second dielectric features directly under the gate spacers remains.

4. The method of claim 1, wherein the replacing of the portion of the cladding layers with the second dielectric features includes:
   removing the portions of the cladding layers to form a trench,
   depositing a dielectric material in the trench to form the second dielectric features, and
   etching back the second dielectric features.

5. The method of claim 4, wherein the etching back of the second dielectric features results in a concaved top surface of the second dielectric features.

6. The method of claim 4, wherein the semiconductor workpiece further includes hard masks over the active regions, and
   wherein the etching back of the second dielectric features includes etching a top portion of the hard masks.

7. The method of claim 1, wherein the recessing of the second dielectric features removes a top portion of the second dielectric features.

8. The method of claim 7, wherein the recessing of the second dielectric features further removes a bottom portion of the second dielectric features below the top portion of the second dielectric features.

9. The method of claim 1, wherein each of the active regions includes a stack of first semiconductor layers and second semiconductor layers over the semiconductor substrate, wherein the first semiconductor layers and the second semiconductor layers have different material compositions and alternate with one another within each of the stacks,
   the method further comprising:
   before the recessing of the second dielectric features, replacing a first portion of the second semiconductor layers to form inner spacers between end portions of vertically adjacent first semiconductor layers;
   after the forming of the source/drain features, removing a remaining portion of the second semiconductor layers to form gaps; and
   forming metal gate stacks in the gaps.

10. A method, comprising:
    receiving a semiconductor workpiece having fin-shaped structures extending along a first direction over a substrate;
    forming first dielectric features between adjacent ones of the fin-shaped structures and extending along the first direction;
    forming a gate stack over the fin-shaped structures and along a second direction perpendicular to the first direction;
    forming second dielectric features between the first dielectric features and the fin-shaped structures;
    etching portions of the fin-shaped structures to form source/drain trenches;
    recessing the second dielectric features, such that a bottom portion of the second dielectric features remains; and
    forming source/drain features in the source/drain trenches.

11. The method of claim 10, wherein the bottom portion of the second dielectric features is a first bottom portion of the second dielectric features, the recessing of the second dielectric features removes a top portion and a second bottom portion of the second dielectric features.

12. The method of claim 10, further comprising forming cladding layers on opposing sidewalls of the fin-shaped structures parallel to the first direction,
wherein the forming of the second dielectric features includes depositing dielectric layers between adjacent cladding layers.

13. The method of claim 12, wherein the semiconductor workpiece further includes hard masks over the fin-shaped structures, and
wherein forming of the second dielectric features further includes:
depositing the dielectric layers over the workpiece, and
recessing the dielectric layers to expose a top surface of the hard masks.

14. A method, comprising:
receiving a semiconductor workpiece having active regions extending above a top surface of a semiconductor substrate;
forming first dielectric features on first opposing sidewalls of the active regions;
forming second dielectric features between the adjacent active regions;
etching portions of the active regions to form source/drain trenches, the source/drain trenches exposing second opposing sidewalls of the active regions;
recessing the first dielectric features; and
forming source/drain features in the source/drain trenches and on the exposed second opposing sidewalls of the active regions, the source/drain features partially formed on top surfaces of the first dielectric features.

15. The method of claim 14, wherein the recessing of the first dielectric features includes reducing a height of the first dielectric features relative to the top surface of the semiconductor substrate.

16. The method of claim 14, wherein the recessing of the first dielectric features includes forming a stepped profile of the source/drain trenches.

17. The method of claim 14, wherein the forming of the first dielectric feature includes:
forming a cladding layer on the first opposing sidewalls of the active regions, the cladding layer having exposed sidewall surfaces;
forming the second dielectric features on the exposed sidewall surfaces of the cladding layer;
removing a portion of the cladding layer between the second dielectric features and the active regions thereby forming gaps therebetween; and
depositing a dielectric material into the gaps.

18. The method of claim 17, wherein each of the active regions includes a stack of first semiconductor layers and second semiconductor layers over the semiconductor substrate, wherein the first semiconductor layers and the second semiconductor layers have different material compositions and alternate with one another within each of the stacks, the method further comprising:
before the recessing of the first dielectric features, replacing a first portion of the second semiconductor layers to form dielectric spacers between end portions of vertically adjacent ones of the first semiconductor layers;
after the forming of the source/drain features, removing a remaining portion of the second semiconductor layers to form gaps; and
forming metal gate stacks in the gaps.

19. The method of claim 18, wherein the first semiconductor layers include crystalline silicon, the second semiconductor layer includes silicon germanium having germanium at a first atomic percentage, and the cladding layer includes silicon germanium having germanium at a second atomic percentage, and wherein the first atomic percentage is different from the second atomic percentage.

20. The method of claim 14, wherein the recessing of the first dielectric features exposes top portions of sidewalls of the second dielectric features, and wherein the forming of the source/drain features includes forming on the exposed top portions of the sidewalls of the second dielectric features.

* * * * *